US008338240B2

(12) United States Patent  
Toriumi et al.

(10) Patent No.: US 8,338,240 B2  
(45) Date of Patent: Dec. 25, 2012

(54) METHOD FOR MANUFACTURING TRANSISTOR

(75) Inventors: Satoshi Toriumi, Kanagawa (JP); Shinobu Furukawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/236,837

(22) Filed: Sep. 20, 2011

(65) Prior Publication Data

US 2012/0083078 A1    Apr. 5, 2012

(30) Foreign Application Priority Data

Oct. 1, 2010 (JP) .................................. 2010-223447

(51) Int. Cl.
*H01L 21/3213* (2006.01)
*H01L 21/336* (2006.01)
*H01L 21/84* (2006.01)

(52) U.S. Cl. . 438/162; 438/158; 438/159; 257/E21.312; 257/E21.414

(58) Field of Classification Search .................. 438/158, 438/159, 162; 257/E21.312, E21.411, E21.414
See application file for complete search history.

(56) References Cited

U.S. PATENT DOCUMENTS

| | | |
|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,311,040 A | 5/1994 | Hiramatsu et al. |
| 5,453,858 A | 9/1995 | Yamazaki |
| 5,514,879 A | 5/1996 | Yamazaki |
| 5,591,987 A | 1/1997 | Yamazaki et al. |
| 5,600,154 A | 2/1997 | Shimizu et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |

(Continued)

FOREIGN PATENT DOCUMENTS

EP         0 449 539 A2      10/1991

(Continued)

OTHER PUBLICATIONS

Kim.C et al., "42.1: A Novel Four-Mask-Count Process Architecture for TFT-LCDS,", SID Digest '00 : SID International Symposium Digest of Technical Papers, 2000, vol. 31, pp. 1006-1009.
Arai.T et al., "41.2: Micro Silicon Technology for Active Matrix OLED Display,", SID Digest '07 : SID International Symposium Digest of Technical Papers, 2007, vol. 38, pp. 1370-1373.
Fujiwara.H et al., "Stress-Induced Nucleation of Microcrystalline Silicon from Amorphous Phase,", Japanese Journal of Applied Physics, May 15, 2002, vol. 41, No. 5A, pp. 2821-2828.

(Continued)

*Primary Examiner* — Mary Wilczewski
(74) *Attorney, Agent, or Firm* — Nixon Peabody, LLP; Jeffrey L. Costellia

(57) ABSTRACT

To provide a method for manufacturing a transistor which has little variation in characteristics and favorable electric characteristics. A gate insulating film is formed over a gate electrode; a semiconductor layer including a microcrystalline semiconductor is formed over the gate insulating film; an impurity semiconductor layer is formed over the semiconductor layer; a mask is formed over the impurity semiconductor layer, and then the semiconductor layer and the impurity semiconductor layer are etched with use of the mask to form a semiconductor stacked body; the mask is removed and then the semiconductor stacked body is exposed to plasma generated in an atmosphere containing a rare gas to form a barrier region on a side surface of the semiconductor stacked body; and a wiring over the impurity semiconductor layer of the semiconductor stacked body is formed.

12 Claims, 18 Drawing Sheets

U.S. PATENT DOCUMENTS

| | | | |
|---|---|---|---|
| 5,859,445 A | 1/1999 | Yamazaki | |
| 5,864,150 A | 1/1999 | Lin | |
| 5,932,302 A | 8/1999 | Yamazaki et al. | |
| 5,998,229 A * | 12/1999 | Lyu et al. | 438/30 |
| 6,011,277 A | 1/2000 | Yamazaki | |
| 6,017,781 A | 1/2000 | Shimizu et al. | |
| 6,023,075 A | 2/2000 | Yamazaki | |
| 6,153,893 A | 11/2000 | Inoue et al. | |
| 6,171,674 B1 | 1/2001 | Yamazaki et al. | |
| 6,183,816 B1 | 2/2001 | Yamazaki et al. | |
| 6,188,085 B1 | 2/2001 | Shimizu et al. | |
| 6,218,206 B1 * | 4/2001 | Inoue et al. | 438/30 |
| 6,252,249 B1 | 6/2001 | Yamazaki | |
| 6,255,146 B1 | 7/2001 | Shimizu et al. | |
| 6,281,520 B1 | 8/2001 | Yamazaki | |
| 6,306,213 B1 | 10/2001 | Yamazaki | |
| 6,372,535 B1 * | 4/2002 | Lyu | 438/30 |
| 6,410,372 B2 | 6/2002 | Flewitt | |
| 6,468,617 B1 | 10/2002 | Yamazaki et al. | |
| 6,468,839 B2 | 10/2002 | Inoue et al. | |
| 6,483,124 B2 | 11/2002 | Flewitt | |
| 6,495,383 B2 * | 12/2002 | Lyu | 438/30 |
| 6,579,749 B2 | 6/2003 | Takechi | |
| 6,737,676 B2 | 5/2004 | Yamazaki | |
| 6,756,258 B2 | 6/2004 | Zhang et al. | |
| 6,835,523 B1 | 12/2004 | Yamazaki et al. | |
| 6,841,431 B2 * | 1/2005 | Lee et al. | 438/158 |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,199,846 B2 | 4/2007 | Lim | |
| 7,229,863 B2 * | 6/2007 | Wu et al. | 438/158 |
| 8,101,444 B2 * | 1/2012 | Yamazaki et al. | 438/30 |
| 2002/0009819 A1 | 1/2002 | Flewitt | |
| 2002/0192851 A1 * | 12/2002 | Ahn | 438/30 |
| 2004/0147133 A1 * | 7/2004 | Lee et al. | 438/721 |
| 2005/0022864 A1 | 2/2005 | Fujioka et al. | |
| 2005/0115930 A1 | 6/2005 | Tanaka et al. | |
| 2007/0181945 A1 | 8/2007 | Nakamura | |
| 2009/0033818 A1 | 2/2009 | Nakajima et al. | |
| 2009/0047758 A1 * | 2/2009 | Yamazaki et al. | 438/158 |
| 2009/0047759 A1 * | 2/2009 | Yamazaki et al. | 438/158 |
| 2009/0047760 A1 * | 2/2009 | Yamazaki et al. | 438/158 |
| 2009/0047761 A1 * | 2/2009 | Yamazaki et al. | 438/158 |
| 2009/0057683 A1 | 3/2009 | Nakajima et al. | |
| 2009/0061574 A1 | 3/2009 | Nakajima et al. | |
| 2009/0114921 A1 | 5/2009 | Yamazaki et al. | |
| 2009/0139447 A1 * | 6/2009 | Toriumi | 117/84 |
| 2009/0321737 A1 | 12/2009 | Isa et al. | |
| 2010/0051949 A1 * | 3/2010 | Yamazaki et al. | 257/57 |
| 2010/0224879 A1 | 9/2010 | Miyairi et al. | |
| 2011/0175091 A1 * | 7/2011 | Kobayashi et al. | 257/57 |
| 2011/0217811 A1 * | 9/2011 | Tanaka et al. | 438/97 |
| 2012/0083078 A1 * | 4/2012 | Toriumi et al. | 438/158 |
| 2012/0094446 A1 * | 4/2012 | Yamazaki et al. | 438/158 |
| 2012/0112186 A1 * | 5/2012 | Ye | 257/43 |

FOREIGN PATENT DOCUMENTS

| | | |
|---|---|---|
| EP | 0 535 979 A2 | 4/1993 |
| JP | 57-071126 | 5/1982 |
| JP | 58-092217 | 6/1983 |
| JP | 59-072781 | 4/1984 |
| JP | 03-278466 | 12/1991 |
| JP | 04-266019 | 9/1992 |
| JP | 05-129608 | 5/1993 |
| JP | 06-326312 | 11/1994 |
| JP | 07-099207 | 4/1995 |
| JP | 07-131030 | 5/1995 |
| JP | 2000-077665 | 3/2000 |
| JP | 2000-216395 | 8/2000 |
| JP | 2000-277439 | 10/2000 |
| JP | 2001-007024 | 1/2001 |
| JP | 2001-053283 | 2/2001 |
| JP | 2004-014958 | 1/2004 |
| JP | 2005-049832 | 2/2005 |
| JP | 2005-167051 | 6/2005 |
| JP | 2005-191546 | 7/2005 |
| JP | 2008-124392 | 5/2008 |
| JP | 2009-135436 | 6/2009 |
| JP | 2009-278075 | 11/2009 |
| WO | WO 02/07207 A1 | 1/2002 |
| WO | WO 2004/086487 | 10/2004 |

OTHER PUBLICATIONS

Kamei.T et al., "A Significant Reduction of Impurity Contents in Hydrogenated Microcrystalline Silicon Films for Increased Grain Size and Reduced Defect Density,", Japanese Journal of Applied Physics, Mar. 1, 1998, vol. 37, No. 3A, pp. L265-L268.

Lee.C et al., "How to Achieve High Mobility Thin Film Transistors by Direct Deposition of Silicon Using 13.56 MHZ RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities,", Applied Physics Letters, Dec. 18, 2006, vol. 89, No. 25, pp. 252101-1-252101-3.

Song.J et al., "34.1: Advanced Four-Mask Process Architecture for the A-Si TFT Array Manufacturing Method,", SID Digest '02 : SID International Symposium Digest of Technical Papers, 2002, vol. 32, pp. 1038-1041.

Choi.S et al., "P-16: Novel Four-Mask Process in the FFS TFT-LCD With Optimum Multiple-Slit Design Applied by the Use of a Gray-Tone Mask,", SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Applied Physics Letters, May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Applied Physics Letters, Feb. 28, 2008, vol. 92, pp. 083509-1-083509-3.

Lee.C et al., "Stability of NC-Si:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Top-Gate TFTS Using 13.56MHz PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C Hydrogenated Nanocrystalline Silicon Plasma-Enhanced Chemical Vapor Deposition Films,", Journal of Applied Physics, Aug. 4, 2005, vol. 98, No. 3, pp. 034305-1-034305-7.

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Real-time spectroscopic ellipsometry studies of the nucleation and grain growth processes in microcrystalline silicon thin films,", Physical Review. B, Feb. 23, 2001, vol. 63, pp. 115306-1-115306-9.

Invitation to pay additional fees (Application No. PCT/JP2009/061795; PCT11623/12200/12401), International Searching Authority, dated Jul. 28, 2009.

International Search Report (Application No. PCT/JP2010/052574; PCT12223), dated Mar. 16, 2010.

Written Opinion (Application No. PCT/JP2010/052574; PCT12223), dated Mar. 16, 2010.

\* cited by examiner

METHOD FOR MANUFACTURING TRANSISTOR

BACKGROUND OF THE INVENTION

1. Field of the Invention

The present invention relates to a method for manufacturing a transistor.

2. Description of the Related Art

For current liquid crystal televisions, bottom-gate (inverted staggered) transistors using amorphous silicon layers have been often used in pixel portions. Amorphous silicon transistors are recognized as structures that can be relatively easily manufactured at low cost.

However, in view of the recent situation of moving images (for example, watching movies in 3D and watching sports in 3D), it has been difficult to express the sharpness of moving images in the case of liquid crystal television including transistors using amorphous silicon layers. Therefore, the development of transistors which operate at high speed and have high mobility has progressed.

REFERENCE

[Patent Document 1] Japanese Published Patent Application No. 2000-216395

SUMMARY OF THE INVENTION

A transistor in which a channel is formed using an amorphous silicon layer has problems such as low field-effect mobility and low on-state current. On the other hand, a transistor in which a channel is formed using a microcrystalline silicon layer has a problem in that, whereas the field-effect mobility is higher than that of a transistor in which a channel is formed using an amorphous silicon layer, off-state current is increased, and thus sufficient switching characteristics cannot be obtained.

The increase in off-state current is caused due to current which leaks from a portion where a source wiring or a drain wiring is in contact with a microcrystalline silicon layer forming a channel (i.e., a side surface of the microcrystalline silicon layer). Thus, off-state current is rapidly increased.

As the countermeasure, in a bottom-gate (inverted staggered) microcrystalline silicon transistor, after formation of a silicon island, oxidation of side surfaces thereof is performed by plasma treatment using oxygen ($O_2$) with use of a dry etching apparatus, so that off-state current (Ioff) can be significantly suppressed.

However, in some transistors over a substrate, a phenomenon occurs in which off-state current jumps suddenly. This is because in the dry etching apparatus at the time of oxidation of the side surfaces of the silicon island, dust such as organic substance or a metal adheres to the side surfaces of the silicon island, and as a result, only the portion becomes a region which is not oxidized; therefore, in the region in each of the manufactured transistors, off-state current flows.

In view of the above, it is an object of an embodiment of the present invention to manufacture a transistor which has little variation in characteristics and favorable electric characteristics.

One embodiment of the present invention is a method for manufacturing a transistor including the steps of forming a gate electrode over a substrate; forming a gate insulating film so as to cover the gate electrode; forming a semiconductor layer including a microcrystalline semiconductor over the gate insulating film; forming an impurity semiconductor layer over the semiconductor layer; forming a mask over the impurity semiconductor layer, and then etching the semiconductor layer and the impurity semiconductor layer with use of the mask to form a semiconductor stacked body; removing the mask and then exposing the semiconductor stacked body to plasma generated in an atmosphere containing a rare gas to form a barrier region on a side surface of the semiconductor stacked body; and forming a wiring over the impurity semiconductor layer of the semiconductor stacked body.

Another embodiment of the present invention is a method for manufacturing a transistor including the steps of forming a gate electrode over a substrate; forming a gate insulating film so as to cover the gate electrode; forming a semiconductor layer including a microcrystalline semiconductor over the gate insulating film; forming an impurity semiconductor layer over the semiconductor layer; forming a mask over the impurity semiconductor layer, and then etching the semiconductor layer and the impurity semiconductor layer with use of the mask to form a semiconductor stacked body; exposing the semiconductor stacked body to plasma generated in an oxygen gas atmosphere or a nitrogen gas atmosphere to form a barrier region on a side surface of the semiconductor stacked body; removing the mask and then exposing the semiconductor stacked body to plasma generated in an atmosphere containing a rare gas; and forming a wiring over the impurity semiconductor layer of the semiconductor stacked body.

Another embodiment of the present invention is a method for manufacturing a transistor including the steps of forming a first gate electrode and a second gate electrode over a substrate; forming a gate insulating film so as to cover the first gate electrode and the second gate electrode; forming a semiconductor layer including a microcrystalline semiconductor over the gate insulating film; forming an impurity semiconductor layer over the semiconductor layer; forming a mask over the impurity semiconductor layer, and then etching the semiconductor layer and the impurity semiconductor layer with use of the mask to form, in a planar structure, a first semiconductor stacked body whose end portion is located outside an end portion of the first gate electrode and a second semiconductor stacked body whose end portion is located inside an end portion of the second gate electrode; exposing the first semiconductor stacked body and the second semiconductor stacked body to plasma generated in an oxygen gas atmosphere or a nitrogen gas atmosphere to form a barrier region on a side surface of each of the first semiconductor stacked body and the second semiconductor stacked body; and removing the mask formed over the first semiconductor stacked body and the second semiconductor stacked body, and then exposing the first semiconductor stacked body and the second semiconductor stacked body to plasma generated in an atmosphere containing a rare gas; and forming a first wiring over the impurity semiconductor layer and in contact with the barrier region of the first semiconductor stacked body and forming a second wiring over the impurity semiconductor layer and in contact with the barrier region of the second semiconductor stacked body.

Note that in a vacuum treatment apparatus such as a dry etching apparatus or a plasma CVD apparatus, the semiconductor stacked body is exposed to plasma generated in a rare gas atmosphere, an oxygen gas atmosphere, or a nitrogen gas atmosphere.

The semiconductor layer and the impurity semiconductor layer are etched with use of the mask to form the semiconductor stacked body, and the mask is removed, whereby a particle such as an organic substance or a metal which adheres to a surface and a side surface of the semiconductor stacked body can be removed. After that, the semiconductor stacked body is exposed to plasma generated in an atmosphere containing a rare gas, whereby the barrier region can be formed on the side surface of the semiconductor stacked body with high uniformity.

The barrier region formed on the side surface of the semiconductor stacked body is an amorphous region which has a wider band gap than a microcrystalline semiconductor region in the semiconductor layer, and it is typically formed of amorphous silicon, amorphous silicon germanium, or the like. Providing the amorphous region which has a wider band gap than the microcrystalline semiconductor region and is between the semiconductor layer and the wiring makes the amorphous region function as a barrier region, and thus holes injected from the wiring to the semiconductor layer can be reduced.

Further, the barrier region provided between the semiconductor layer and the wiring includes at least an amorphous region and may include an insulating region. The insulating region is formed using semiconductor oxide or semiconductor nitride. Examples of the semiconductor oxide include silicon oxide, silicon oxynitride, and the like. Examples of the semiconductor nitride include silicon nitride, silicon nitride oxide, and the like. Providing the insulating region between the semiconductor layer and the wiring makes the insulating region function as a barrier region, and thus, holes injected from the wiring to the semiconductor layer can be reduced.

Note that a transistor having a first gate electrode is provided for a driver circuit of a display device, and a transistor having a second gate electrode is provided for a pixel portion of the display device.

Further, the atmosphere containing a rare gas may include a gas containing phosphorus or boron. Typical examples of the gas containing phosphorus or boron include phosphine, diborane, and the like.

Further, the plasma generated in the atmosphere containing a rare gas may be generated under a high pressure. Here, the high pressure is greater than or equal to 100 Pa and less than or equal to 10000 Pa, preferably greater than or equal to 1000 Pa and less than or equal to 4000 Pa.

Further, the semiconductor layer including a microcrystalline semiconductor may be a microcrystalline semiconductor layer. Alternatively, the semiconductor layer including a microcrystalline semiconductor may comprise a microcrystalline semiconductor layer in contact with the gate insulating layer and an amorphous semiconductor layer in contact with the microcrystalline semiconductor layer.

Note that the term "on-state current" refers to current which flows between a source electrode and a drain electrode when a transistor is on. For example, in the case of an n-channel transistor, the on-state current refers to current which flows between the source electrode and the drain electrode when gate voltage is higher than the threshold voltage of the transistor.

In addition, the term "off-state current" refers to current which flows between a source electrode and a drain electrode when a transistor is off. For example, in the case of an n-channel transistor, the off-state current refers to current which flows between a source electrode and a drain electrode when gate voltage is lower than the threshold voltage of the transistor.

Thus, a transistor which has little variation in characteristics and favorable electric characteristics can be manufactured.

DETAILED DESCRIPTION OF THE INVENTION

Figure 1A:
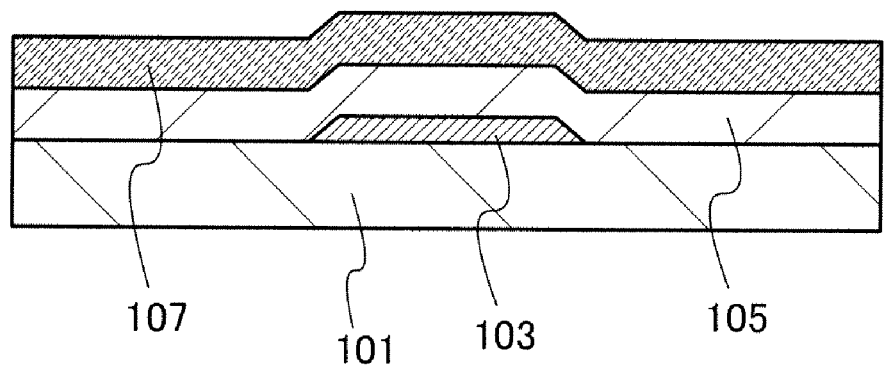
FIGS. 1A and 1B are cross-sectional views illustrating a method for manufacturing a transistor according to an embodiment of the present invention.

Embodiments of the present invention will be described below with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments and an example. Note that reference numerals denoting the same portions are commonly used in different drawings in describing the structure of the present invention.

Embodiment 1

In this embodiment, a method for manufacturing a transistor according to one embodiment of the present invention will be described. Note that an n-channel transistor has higher carrier mobility than a p-channel transistor. Further, it is preferable that all transistors formed over the same substrate have the same polarity because the number of manufacturing steps can be reduced. Therefore, in this embodiment, a method for manufacturing an n-channel transistor will be described.

As illustrated in FIG. 1A, a gate electrode 103 is formed over a substrate 101. Next, a gate insulating layer 105 is formed so as to cover the gate electrode 103. After that, a microcrystalline semiconductor layer 107 is formed.

As the substrate 101, a glass substrate; a ceramic substrate; a plastic substrate which has high heat resistance enough to withstand a process temperature of this manufacturing process; or the like can be used. In the case where a substrate does not need a light-transmitting property, a metal substrate such as a stainless alloy substrate, whose surface is provided with an insulating layer, may be used. As the glass substrate, for example, an alkali-free glass substrate of barium borosilicate glass, aluminoborosilicate glass, aluminosilicate glass, or the like may be used. Further, as the substrate 101, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrode 103 can be formed in such a manner that a conductive layer is formed over the substrate 101 by a sputtering method or a vacuum evaporation method, a mask is formed over the conductive layer by a photolithography method, an inkjet method, or the like, and the conductive layer is etched using the mask. Alternatively, the gate electrode 103 can be formed by discharging a conductive nanopaste of silver, gold, copper, or the like over the substrate by an inkjet method and baking the conductive nanopaste. Here, a conductive layer is formed over the substrate 101 and etched with use of a resist mask formed using a photomask, so that the gate electrode 103 is formed.

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. A semiconductor material typified by polycrystalline silicon that is doped with an impurity element such as phosphorus, an AgPdCu alloy, or the like may be used.

For example, as a two-layer structure of the gate electrode 103, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure of a titanium nitride layer and a molybdenum layer, a two-layer structure of a copper-magnesium alloy layer and a copper layer, a two-layer structure of a copper-manganese alloy layer and a copper layer, or the like. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used. When the gate electrode 103 has such a stacked-layer structure, a metal layer serving as a barrier layer is stacked over a layer with low electric resistance, so that the electric resistance can be lowered, and a metal element can be prevented from diffusing from the metal layer into the semiconductor layer.

Note that side surfaces of the gate electrode 103 are preferably tapered. This is in order to prevent disconnection at a step portion, because an insulating layer, a semiconductor layer, and a wiring layer are formed over the gate electrode 103 in subsequent steps. In order to form the side surfaces of the gate electrode 103 into a tapered shape, etching may be performed while the resist mask is made to recede.

Through the step of forming the gate electrode 103, a gate wiring (a scanning line) and a capacitor wiring can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode 103 and either or both a gate wiring and a capacitor wiring may be formed separately.

The gate insulating layer 105 can be formed as a single layer or a stacked layer using a silicon oxide layer, a silicon nitride layer, a silicon oxynitride layer, or a silicon nitride-oxide layer by a CVD method, a sputtering method, or the like. Further, the gate insulating layer 105 is formed using a silicon oxide layer or a silicon oxynitride layer, so that fluctuation in threshold voltage of the transistor can be decreased. In a step of forming the gate insulating layer 105 by a CVD method, glow discharge plasma is generated by applying high-frequency power with a frequency of 3 MHz to 30 MHz, typically 13.56 MHz or 27.12 MHz, or high-frequency power in the VHF band with a frequency greater than 30 MHz and less than or equal to about 300 MHz, typically 60 MHz. Alternatively, glow discharge plasma is generated by applying high frequency power with a microwave frequency of greater than or equal to 1 GHz. Note that the use of the high frequency power in the VHF band or with the microwave frequency can increase the deposition rate. Note that a pulsed oscillation by which high-frequency power is applied in a pulsed manner or a continuous oscillation by which high-frequency power is applied continuously may be applied. In addition, high frequency power in the HF band is superimposed with high frequency power in the VHF band, whereby unevenness of plasma in a large-sized substrate is also reduced, the uniformity can be increased, and the deposition rate can be increased. When the gate insulating layer 105 is formed at a high frequency (greater than or equal to 1 GHz) using a microwave plasma CVD apparatus, the withstand voltage between the gate electrode and the drain and source electrodes can be improved, so that a highly reliable transistor can be obtained.

Further, when a silicon oxide layer is formed as the gate insulating layer 105 by a CVD method using an organosilane gas, the crystallinity of the semiconductor layer to be formed later can be improved, so that the on-state current and the field-effect mobility of the transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The microcrystalline semiconductor layer 107 is formed using a microcrystalline semiconductor layer typified by a microcrystalline silicon layer, a microcrystalline silicon-germanium layer, or the like. The thickness of the microcrystalline semiconductor layer 107 is preferably 3 nm to 100 nm, more preferably 5 nm to 50 nm. In the case where the microcrystalline semiconductor layer 107 is too thin, the on-state current of the transistor is reduced. In the case where the microcrystalline semiconductor layer 107 is too thick, the off-state current of the transistor is increased when the transistor operates at a high temperature. The thickness of the microcrystalline semiconductor layer 107 is set to 3 nm to 100 nm, preferably, 5 nm to 50 nm, whereby the on-state current and the off-state current of the transistor can be controlled.

In a reaction chamber of the plasma CVD apparatus, the microcrystalline semiconductor layer 107 is formed by glow discharge plasma with use of a mixed gas which includes hydrogen and a deposition gas containing silicon. Alternatively, the microcrystalline semiconductor layer 107 may be formed by glow discharge plasma with use of a mixture of a deposition gas containing silicon, hydrogen, and a rare gas such as helium, argon, neon, krypton, or xenon. Here, a microcrystalline silicon layer is formed under the condition in which the deposition gas containing silicon is diluted with hydrogen by setting the flow rate of hydrogen 10 times to 2000 times, preferably 10 times to 200 times that of the deposition gas containing silicon. Note that when a deposition gas containing germanium is used together with the deposition gas containing silicon, a microcrystalline silicon germanium layer can be formed as a microcrystalline semiconductor layer. The deposition temperature in that case is preferably a room temperature to 300° C., more preferably, 200° C. to 280° C.

Typical examples of the deposition gas containing silicon include silane, disilane, and the like. Typical examples of the deposition gas containing germanium include germane, digermane, and the like.

In the case where the gate insulating layer 105 is formed using a silicon nitride layer, at an early stage of deposition of the microcrystalline semiconductor layer 107, an amorphous semiconductor region is easily formed. Therefore, crystallinity of the microcrystalline semiconductor layer 107 becomes low and electric characteristics of the transistor are impaired. Therefore, when the gate insulating layer 105 is formed using a silicon nitride layer, the microcrystalline semiconductor layer 107 is preferably deposited under the condition that the dilution rate of the deposition gas containing silicon is high or under the low temperature condition. Typically, the high dilution rate condition in which the flow rate of hydrogen is 200 times to 2000 times, more preferably 250 times to 400 times that of the deposition gas containing silicon is preferable. In addition, the low temperature condition in which the temperature for deposition of the microcrystalline semiconductor layer 107 is 200° C. to 250° C. is preferable. When the high dilution rate condition or the low temperature condition is employed, initial nucleation density is increased, an amorphous semiconductor region formed over the gate insulating layer 105 is reduced, and the crystallinity of the microcrystalline semiconductor layer 107 is improved. Furthermore, when the surface of the gate insulating layer 105 formed using a silicon nitride layer is subjected to oxidation treatment, the adhesion of the microcrystalline semiconductor layer 107 to the gate insulating layer 105 is improved. As oxidation treatment, exposure to an oxidizing gas, plasma treatment in an oxidizing gas atmosphere, or the like can be used.

A rare gas such as helium, argon, neon, krypton, or xenon is mixed into the deposition gas containing silicon as a source gas for the microcrystalline semiconductor layer 107, whereby the deposition rate of the microcrystalline semiconductor layer 107 can be increased. Moreover, since the deposition rate is increased, the amount of impurities mixed into the microcrystalline semiconductor layer 107 is reduced; thus, the crystallinity of the microcrystalline semiconductor layer 107 can be improved. Accordingly, the on-state current and the field-effect mobility of the transistor are increased and the throughput of the transistor can also be increased.

When the microcrystalline semiconductor layer 107 is formed, glow discharge plasma is generated by applying high frequency power of 3 MHz to 30 MHz, typically, high frequency power of 13.56 MHz or 27.12 MHz in the HF band, or high frequency power of approximately 30 MHz to 300 MHz in the VHF band, typically 60 MHz. Alternatively, glow discharge plasma is generated by applying high frequency power at a microwave frequency of greater than or equal to 1 GHz. Note that a pulsed oscillation by which high-frequency power is applied in a pulsed manner or a continuous oscillation by which high-frequency power is applied continuously may be applied. In addition, high frequency power in the HF band is superimposed with high frequency power in the VHF band, whereby unevenness of plasma in a large-sized substrate is also reduced, the uniformity can be increased, and the deposition rate can be increased.

Figure 1B:
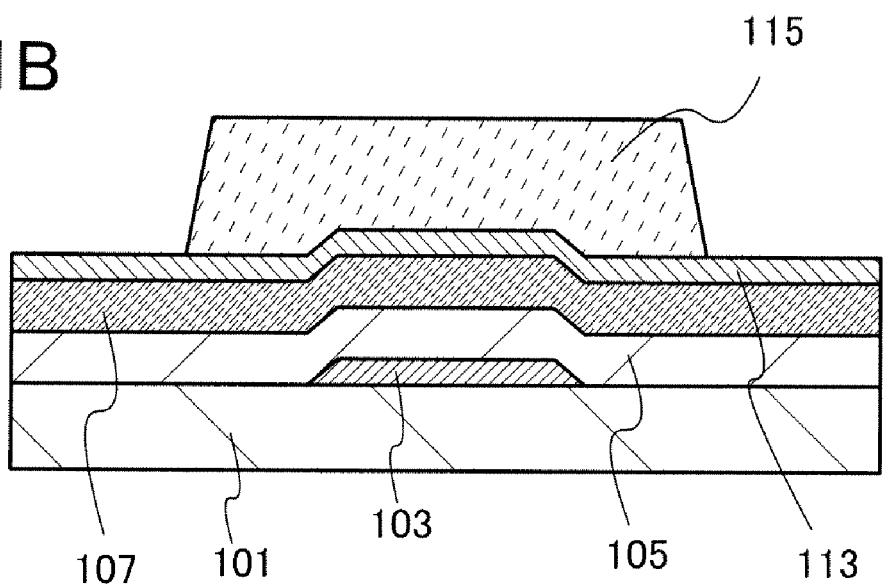

Next, as illustrated in FIG. 1B, an impurity semiconductor layer 113 is formed over the microcrystalline semiconductor layer 107. Next, a resist mask 115 is formed over the impurity semiconductor layer 113.

The impurity semiconductor layer 113 is formed by glow discharge plasma with a mixture of the deposition gas containing silicon, hydrogen, and phosphine (or with a mixed gas diluted with hydrogen or silane) in the reaction chamber of the plasma CVD apparatus. Amorphous silicon to which phosphorus is added or microcrystalline silicon to which phosphorus is added is formed by dilution of the deposition gas containing silicon with hydrogen. Note that in the case of manufacturing a p-channel transistor, the impurity semiconductor layer 113 may be formed by glow discharge plasma using diborane instead of phosphine.

The resist mask 115 can be formed by a photolithography step.

Next, with use of the resist mask 115, the microcrystalline semiconductor layer 107 and the impurity semiconductor layer 113 are etched. Through this step, the microcrystalline semiconductor layer 107 and the impurity semiconductor layer 113 are divided into elements, so that a semiconductor stacked body 400 is formed. Note that the semiconductor stacked body 400 includes a stacked layer of a microcrystalline semiconductor layer 117 and an impurity semiconductor layer 121.

Figure 2A:
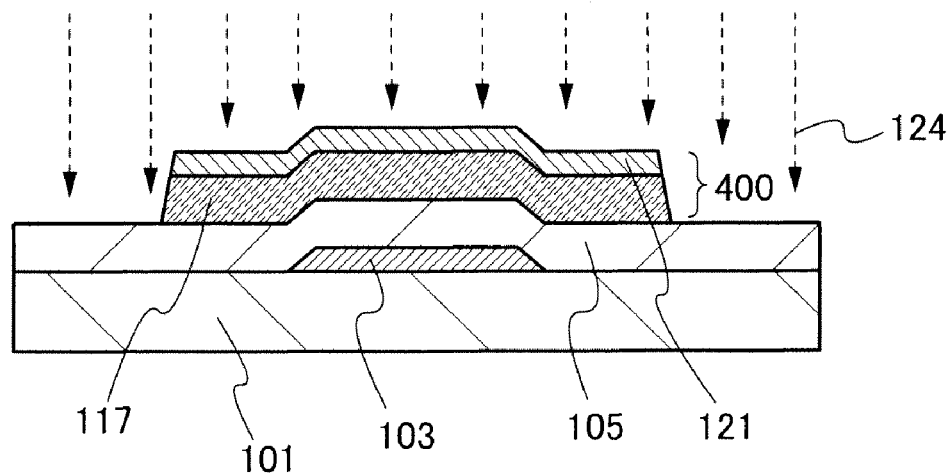
FIGS. 2A and 2B are cross-sectional views illustrating a method for manufacturing a transistor according to an embodiment of the present invention.
Figure 2B:
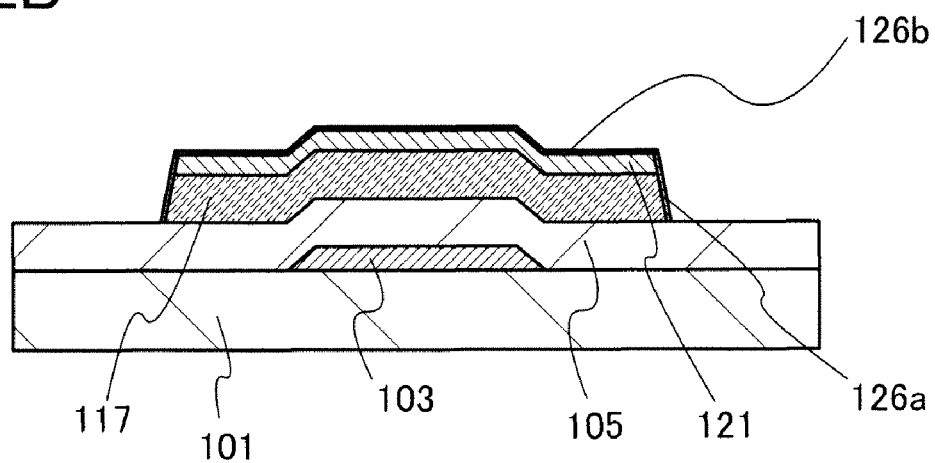

Next, after the resist mask 115 is removed, plasma treatment in which a side surface of the microcrystalline semiconductor layer 117 and a top surface and a side surface of the impurity semiconductor layer 121 are exposed to plasma 124 is performed (see FIG. 2A). Here, in a vacuum treatment apparatus such as a dry etching apparatus, a plasma CVD apparatus, or the like, plasma is generated in an atmosphere of a rare gas such as helium, neon, argon, krypton, or xenon, and the semiconductor stacked body 400 is exposed to the plasma 124. Generation of plasma in a rare gas atmosphere causes a rare-gas radical to be generated. The radical has low reactivity though it has energy; this radical breaks the bonds between atoms in the microcrystalline semiconductor layer 117 and the impurity semiconductor layer 121, which reduces density of the semiconductor layer. In particular, in the microcrystalline semiconductor layer 117, defects are caused by reduction in density, and the microcrystalline semiconductor layer 117 is made amorphous. Therefore, a first barrier region 126a is formed on a side surface of the semiconductor stacked body, and a second barrier region 126b is formed over a top surface of the semiconductor stacked body (see FIG. 2B). In this manner, the microcrystalline semiconductor layer 107 and the impurity semiconductor layer 113 are etched with use of the resist mask 115 to form the semiconductor stacked body 400, and the resist mask 115 is removed, so that a particle such as an organic substance or a metal which adheres to the top surface and the side surface of the semiconductor stacked body 400 can be removed. After that, the semiconductor stacked body 400 is exposed to the plasma 124 generated in an atmosphere containing a rare gas, whereby the barrier regions can be formed on the top surface and the side surface of the semiconductor stacked body with high uniformity.

Further, the rare gas atmosphere may contain a gas including phosphorus or boron. Typical examples of a gas including phosphorus or boron include phosphine, diborane, and the like.

Further, the plasma 124 generated in the rare gas atmosphere may be generated under a high pressure. Here, the high pressure is greater than or equal to 100 Pa and less than or equal to 10000 Pa, preferably greater than or equal to 1000 Pa and less than or equal to 4000 Pa.

The energy levels of a wiring and a semiconductor layer are described below with reference to FIGS. 3A to 3C. Here, metal represents a wiring and Si represents a semiconductor.

Figure 3A:
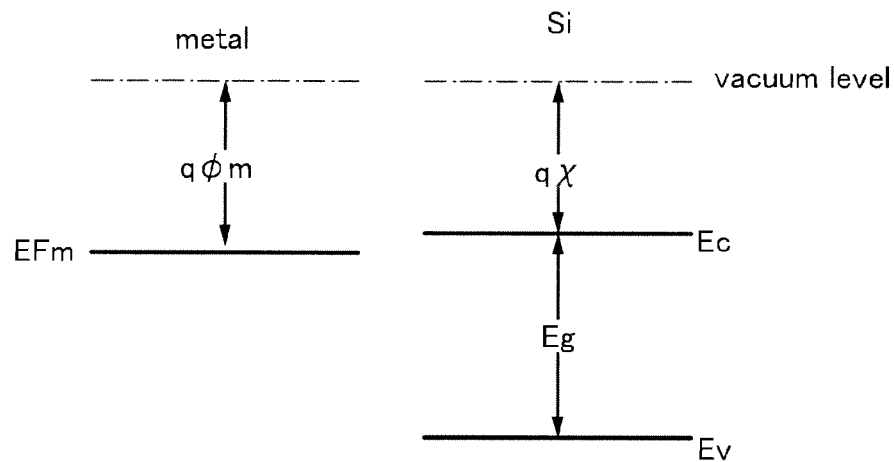
FIGS. 3A to 3C each shows a band gap of a transistor according to an embodiment of the present invention.

FIG. 3A shows, in a state where voltage is not applied to the gate electrode (Vg=0), a relation among the vacuum level, the work function (q$\phi$m), and the Fermi level (EFm) of the metal and a relation among the vacuum level, the electron affinity (q$\chi$), the band gap (Eg) of the semiconductor.

Figures 3B, 3C:
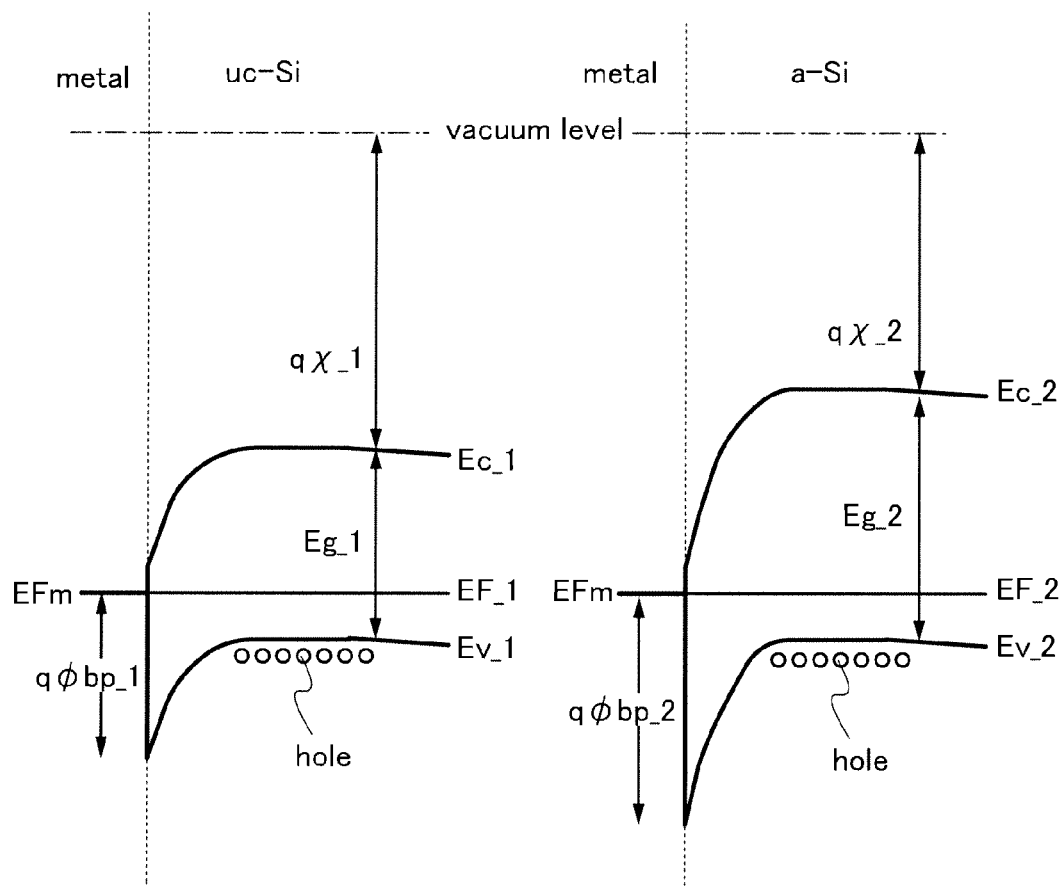

FIG. 3B and FIG. 3C each show the energy levels of a metal and a semiconductor in the state where negative voltage is applied to the gate electrode (Vg<0). FIG. 3B shows the case where the semiconductor layer is formed using microcrystalline silicon, and FIG. 3C shows the case where the semiconductor layer is formed using amorphous silicon. Note that Eg_1, Ec_1, EF_1, Ev_1, q$\phi$bp_1, and q$\chi$_1 represent the band gap, the bottom of the conduction band, the Fermi level, the upper end of the valence band, the barrier energy, and the electron affinity, respectively, of microcrystalline silicon. Eg_2, Ec_2, EF_2, Ev_2, q$\phi$bp_2, and q$\chi$_2 represent the band gap, the bottom of the conduction band, the Fermi level, the upper end of the valence band, the barrier energy, the electron affinity, respectively, of amorphous silicon.

The height of barrier q$\phi$bp between the metal and the semiconductor in the sate where the negative voltage is applied to the gate electrode (Vg<0) is a difference between the valence band Ev and the Fermi level EFm at the junction surface between the metal and the semiconductor. The height of barrier q$\phi$bp_1 in the case where the semiconductor is microcrystalline silicon can be represented by Mathematical Formula 1.

$$q\phi bp\_1 = Eg\_1 - q(\phi m - \chi\_1) \quad \text{(Mathematical Formula 1)}$$

The height of barrier q$\phi$bp_2 in the case where the semiconductor is amorphous silicon can be represented by Mathematical Formula 2.

$$q\phi bq\_2 = Eg\_2 - q(\phi m - \chi\_2) \quad \text{(Mathematical Formula 2)}$$

Since the band gap Eg_2 of amorphous silicon is wider than the band gap Eg_1 of microcrystalline silicon, the height of barrier can be increased by employing typically, amorphous silicon which serves as a barrier region as a semiconductor in contact with metal. As a result, holes injected from the semiconductor to the metal are reduced, and the off-state current is reduced.

Figure 4A:
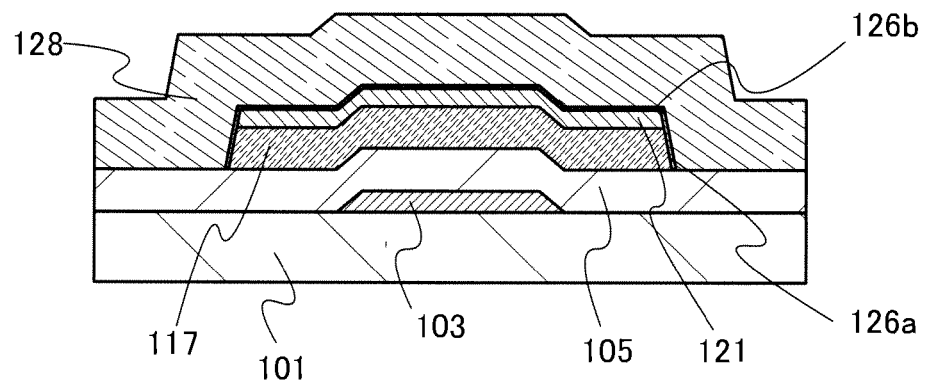
FIGS. 4A to 4C are cross-sectional views illustrating a method for manufacturing a transistor according to an embodiment of the present invention.

Next, a conductive layer 128 is formed over the impurity semiconductor layer 121 and the microcrystalline semiconductor layer 117 (see FIG. 4A).

The conductive layer 128 can be formed in a single layer or a stacked layer of aluminum, copper, titanium, neodymium, scandium, molybdenum, chromium, tantalum, tungsten, or the like. Alternatively, the conductive layer 128 may be formed using an aluminum alloy to which an element for preventing hillocks is added (e.g. an Al—Nd alloy). Alternatively, crystalline silicon to which an impurity element which serves as a donor is added may be used. Further, the conductive layer 128 may have a stacked-layer structure obtained as follows; a layer, which is in contact with the crystalline silicon to which an impurity element serving as a donor is added, is formed using titanium, tantalum, molybdenum, tungsten, or nitride of any of these elements, and then aluminum or an aluminum alloy is formed thereover. Further alternatively, the conductive layer 128 may have a stacked-layer structure in which upper and lower surfaces of aluminum or an aluminum alloy are sandwiched between titanium, tantalum, molybdenum, tungsten, or a nitride of any of these elements.

The conductive layer 128 is formed by a CVD method, a sputtering method, or a vacuum evaporation method. Alternatively, the conductive layer 128 may be formed by discharging a conductive nanopaste of silver, gold, copper, or the like by a screen printing method, an ink-jet method, or the like and baking the conductive nanopaste.

Figure 4B:
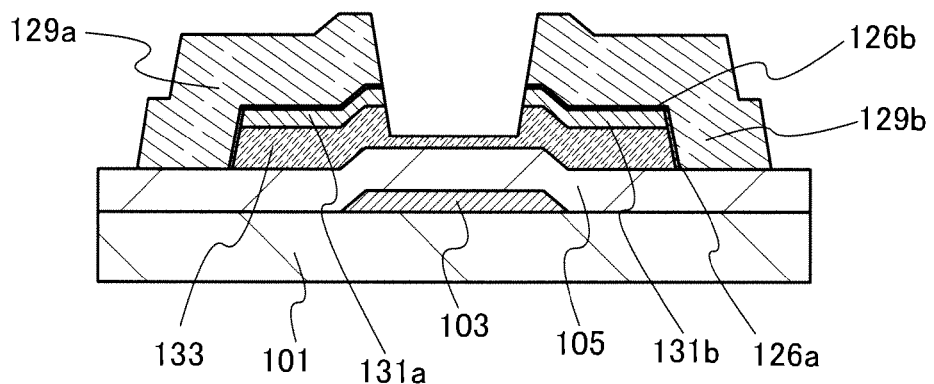

Next, a resist mask is formed through a photolithography process. The conductive layer 128, the impurity semiconductor layer 121, and the microcrystalline semiconductor layer 117 are partially etched with use of the resist mask to form a wiring 129a and a wiring 129b which serve as a source electrode and a drain electrode and a pair of impurity semiconductor layers 131a and 131b which serve as a source region and a drain region. Further, a microcrystalline semiconductor layer 133 is formed (see FIG. 4B).

One of the wirings 129a and 129b serves not only as a source or drain electrodes but also as a signal line. However, without limitation thereto, a signal line may be provided separately from the source and drain electrodes.

Since dry etching is used in the etching step here, the end portions of the wirings 129a and 129b are aligned with end portions of the impurity semiconductor layers 131a and 131b. If the conductive layer 128 is subjected to wet etching and the impurity semiconductor layer 121 is subjected to dry etching, the end portions of the wirings 129a and 129b and the end portions of the impurity semiconductor layers 131a and 131b are not aligned. In a cross section in such a case, the end portions of the wirings 129a and 129b are positioned on the inner side than the end portions of the impurity semiconductor layers 131a and 131b.

Next, a surface of the microcrystalline semiconductor layer 133 may be subjected to plasma treatment, typically, water plasma treatment, oxygen plasma treatment, ammonia plasma treatment, nitrogen plasma treatment, plasma treatment using a mixed gas of oxygen and hydrogen, or the like.

Water plasma treatment can be performed in such a manner that a gas containing water typified by water vapor (H$_2$O vapor) as a main component is introduced into a reaction chamber so that plasma is generated. After that, the resist mask is removed. Note that the resist mask may be removed before dry etching.

As described above, after formation of the microcrystalline semiconductor layer 133, water plasma treatment is performed on the microcrystalline semiconductor layer 133, whereby a residue of the resist mask can also be removed. Further, by the plasma treatment, insulation between the source region and the drain region can be ensured, and thus, in the transistor to be completed, the off-state current can be reduced and variation in electric characteristics can be reduced.

Next, an insulating layer 137 is formed. The insulating layer 137 can be formed in a manner similar to that for the gate insulating layer 105. Alternatively, the insulating layer 137 can be formed using an organic resin layer. As the organic resin layer, acrylic, epoxy, polyimide, polyamide, polyvinylphenol, benzocyclobutene, or the like can be used. Alternatively, a siloxane polymer can be used.

Next, an opening portion (not illustrated) is formed in the insulating layer 137 with use of a resist mask formed through a photolithography process. Next, a wiring electrode 139 is formed.

The wiring electrode 139 can be formed in such a manner that a thin film is formed using the same material as the gate electrode 103 by a sputtering method and is etched with use of a resist mask formed through a photolithography process. Alternatively, the wiring electrode 139 can be formed by applying or printing a conductive composition including a conductive polymer having a light-transmitting property, and baking the composition (see FIG. 4C).

The wiring electrode 139 is formed so as to overlap with a channel formation region formed using the microcrystalline semiconductor layer, whereby the wiring electrode 139 can be also used as a back gate electrode, so that a dual-gate transistor can be obtained.

Next, a form of the wiring electrode 139 used as a back-gate electrode will be described with reference to FIGS. 5A to 5D that are plan views of the transistors.

Figure 5A:
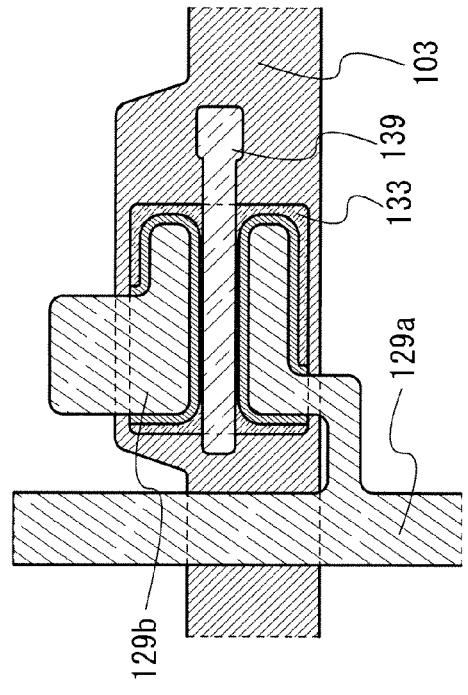
FIGS. 5A to 5D are plan views each illustrating a method for manufacturing a transistor according to an embodiment of the present invention.

As illustrated in FIG. 5A, the wiring electrode 139 used as a back-gate electrode can be formed in parallel to the gate electrode 103. In this case, each of potential applied to the wiring electrode 139 and potential applied to the gate electrode 103 can be controlled independently. Thus, the threshold voltage of the transistor can be controlled. Further, regions in which carriers flow, that is, channel regions, are formed on the gate insulating film 105 side and on the insulating film 137 side in the semiconductor region; thus, the on-state current of the transistor can be increased.

Figure 5B:
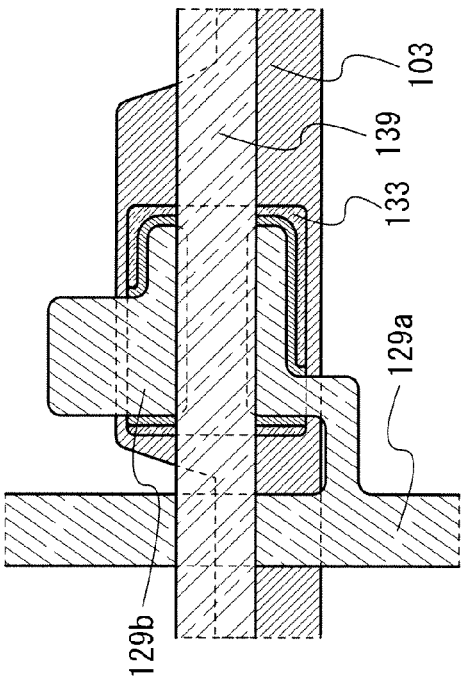

As illustrated in FIG. 5B, the wiring electrode 139 can be connected to the gate electrode 103. That is, the gate electrode 103 and the wiring electrode 139 can be connected through an opening 149 formed in the gate insulating layer 105 and the insulating layer 137. In this case, potential applied to the wiring electrode 139 and potential applied to the gate electrode 103 are equal to each other. As a result, in the semiconductor layer, regions where carriers flow, that is, channel regions are formed on the gate insulating layer 105 side and on the insulating layer 137 side in the semiconductor region; thus, the on-state current of the transistor can be increased.

Figure 5C:
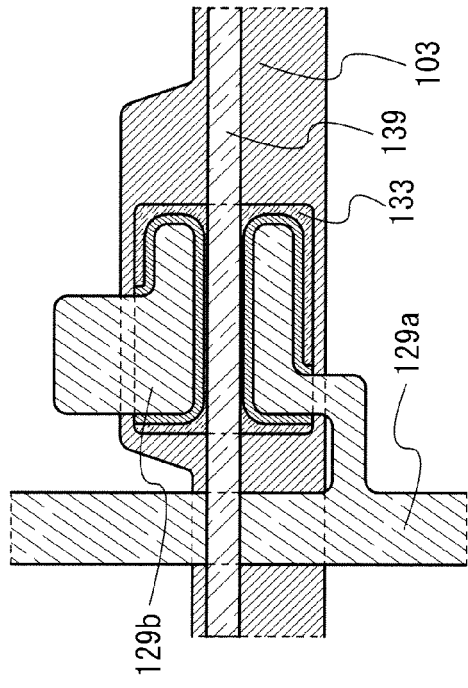

As illustrated in FIG. 5C, the wiring electrode 139 is not necessarily connected to the gate electrode 103 but may be in a floating state. In that case, channel regions are formed on the gate insulating film 105 side and on the insulating film 137 side in the semiconductor region without applying voltage to the wiring electrode 139; thus, the on-state current of the transistor can be increased.

Figure 5D:
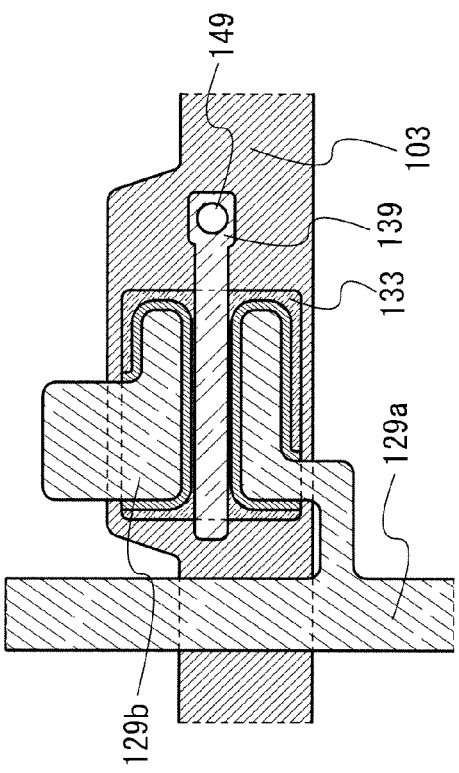

As illustrated in FIG. 5D, the wiring electrode 139 may overlap with the wirings 129a and 129b with the insulating layer 137 interposed therebetween. Although the wiring electrode 139 having the structure of FIG. 5A is used here, the wiring electrode 139 of FIG. 5B or FIG. 5C may also overlap with the wirings 129a and 129b.

In the dual-gate transistor, potential applied to the gate electrode 103 and potential applied to the wiring electrode 139 can be different from each other. Thus, the threshold voltage of the transistor can be controlled. Alternatively, the gate electrode 103 and the wiring electrode 139 can be supplied with the same level of potential. Thus, channels are formed at two portions of the microcrystalline semiconductor layer 133, one of which is a vicinity of an interface between the gate insulating layer 105 and the microcrystalline semiconductor layer 133 and the other of which is a vicinity of an interface between the insulating layer 137 and the microcrystalline semiconductor layer 133.

In the dual-gate transistor described in this embodiment, two channels where carriers flow are formed in the vicinity of the interface between the microcrystalline semiconductor region 133 and the gate insulating layer 105 and in the vicinity of the interface between the microcrystalline semiconductor region 133 and the insulating layer 137. Thus, the amount of transferring carriers is increased, and the on-state current and the field-effect mobility can be increased.

In a method for manufacturing a transistor described in this embodiment, the microcrystalline semiconductor layer and the impurity semiconductor layer are etched with use of the resist mask to form the semiconductor stacked body, and after the resist mask is removed, the semiconductor stacked body is exposed to plasma generated in an atmosphere containing a rare gas, whereby the barrier region can be formed on the side surface of the semiconductor stacked body with high uniformity. The first barrier region 126a is provided between the microcrystalline semiconductor layer 133 and the wirings 129a and 129b with high uniformity, whereby holes injected from the wirings 129a and 129b to the microcrystalline semiconductor layer 133 can be reduced, so that a transistor which has low off-state current, high on-state current, and high field-effect mobility can be manufactured. Therefore, the size of the transistor can be decreased, and high integration of a semiconductor device can be achieved. Further, when the transistor described in this embodiment is used for a driver circuit of a display device, the size of the driver circuit can be decreased, which enables the frame of the display device to be narrowed.

Figure 4C:
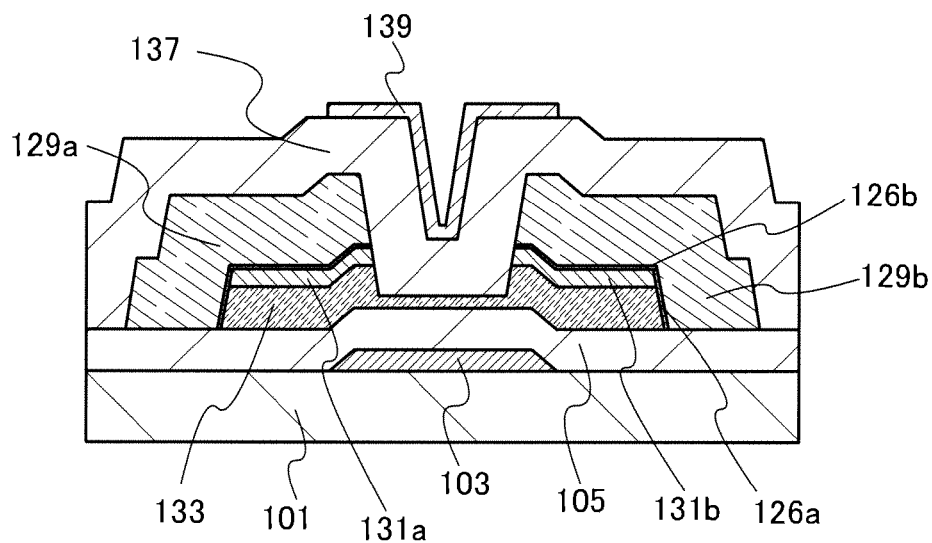

Through the above steps, a transistor whose channel formation region is formed using a microcrystalline semiconductor layer, like the transistor illustrated in FIG. 4C, can be manufactured. Thus, a transistor having little variation in characteristics, high on-state current, and high field-effect mobility can be manufactured.

Note that this embodiment can be applied to any of the other embodiments.

Embodiment 2

Figure 6A:
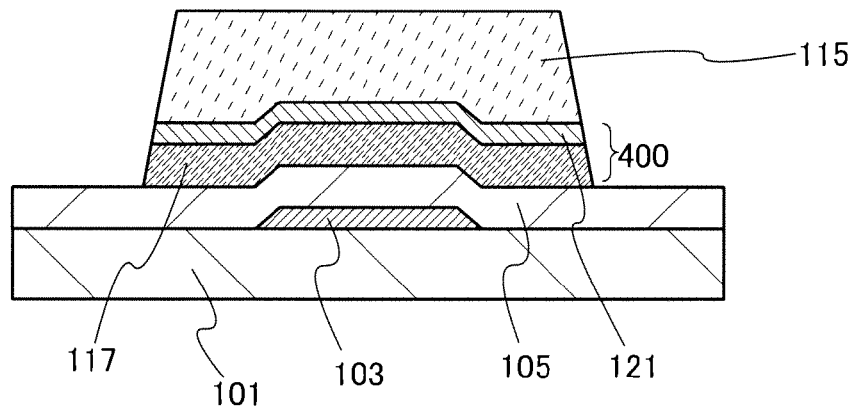
FIGS. 6A to 6C are cross-sectional views illustrating a method for manufacturing a transistor according to an embodiment of the present invention.

In this embodiment, a method for manufacturing a transistor having a structure different from that of Embodiment 1 will be described with reference to FIGS. 6A to 6C. A difference between this embodiment and Embodiment 1 is in a method for forming the barrier region.

In a manner similar to that of Embodiment 1, the gate electrode 103, the gate insulating layer 105, and the semiconductor stacked body 400 are formed over the substrate 101 through the steps of FIGS. 1A and 1B. Note that the semiconductor stacked body 400 includes a stacked layer of the microcrystalline semiconductor layer 117 and the impurity semiconductor layer 121 (see FIG. 6A).

Figure 6B:
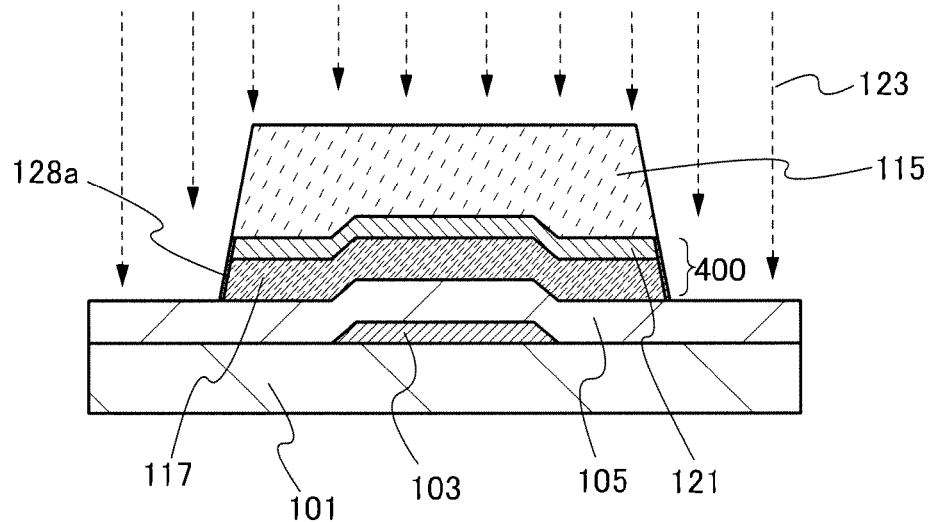

Next, plasma treatment in which a side surface of the semiconductor stacked body 400 is exposed to plasma 123 is performed with the resist mask 115 left (see FIG. 6B). Here, in a vacuum treatment apparatus such as a dry etching apparatus, a plasma CVD apparatus, or the like, plasma is generated in an oxidizing gas or a nitriding gas, and the semiconductor stacked body 400 is exposed to the plasma 123. Examples of the oxidizing gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. Generation of plasma in an oxidizing gas atmosphere or a nitriding gas atmosphere causes an oxygen radical or a nitrogen radical to be generated. The radical reacts with the semiconductor stacked body 400, thereby forming a barrier region 128a which is an insulating region on the side surface of the semiconductor stacked body 400. Note that instead of irradiation with plasma, irradiation with ultraviolet light may be employed for generation of an oxygen radical or a nitrogen radical.

Figure 6C:
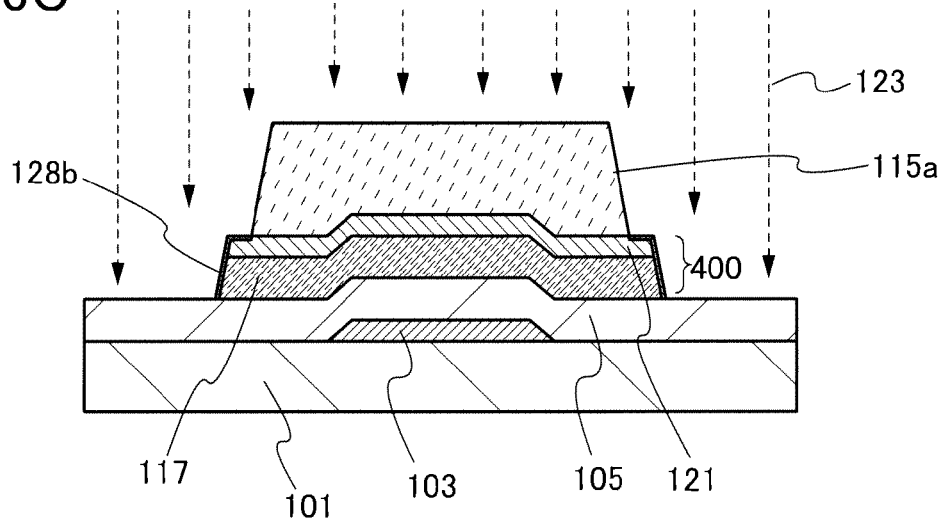

In the case of using oxygen, ozone, water vapor, or a mixed gas of oxygen and hydrogen as the oxidizing gas, the resist recedes by plasma irradiation, and a resist mask 115a having a smaller top surface than the resist mask 115 is formed as illustrated in FIG. 6C. By the plasma treatment, the exposed impurity semiconductor layer 121 as well as the side surface of the semiconductor stacked body 400 is oxidized, so that a barrier region 128b is formed on the side surface of the semiconductor stacked body 400 and part of the top surface of the impurity semiconductor layer 121.

Figure 7A:
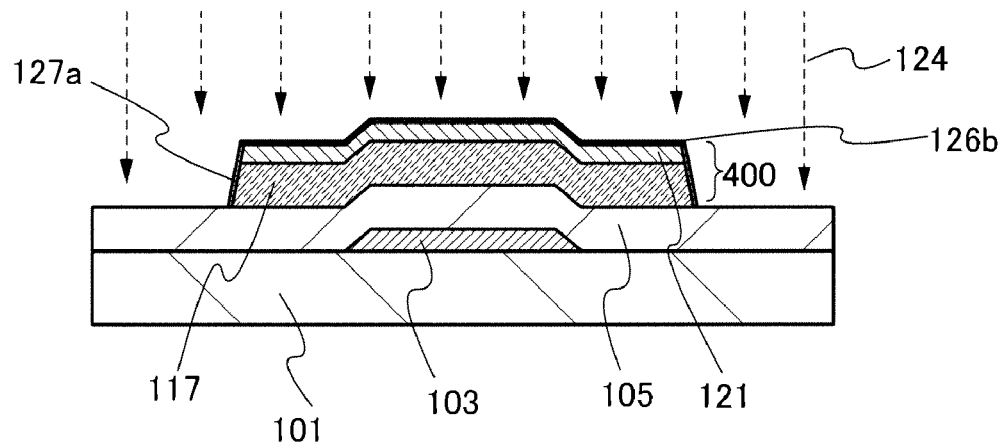
FIGS. 7A and 7B are cross-sectional views illustrating a method for manufacturing a transistor according to an embodiment of the present invention.

Next, after the resist mask 115 is removed, plasma treatment is performed in which a surface of the semiconductor stacked body 400 is exposed to the plasma 124 (see FIG. 7A). Here, plasma is generated in an atmosphere of a rare gas such as helium, neon, argon, krypton, or xenon, and the semiconductor stacked body 400 is exposed to the plasma 124. Generation of plasma in a rare gas atmosphere causes a rare-gas radical to be generated. The radical has low reactivity though it has energy; this radical breaks the bonds between atoms in the semiconductor stacked body 400, which reduces density of the semiconductor layer. In particular, in the microcrystalline semiconductor layer 117, defects are caused by reduction in density, and the microcrystalline semiconductor layer 117 is made amorphous.

In this manner, the microcrystalline semiconductor layer 117 and the impurity semiconductor layer 121 are etched with use of the resist mask 115 to form the semiconductor stacked body 400, the semiconductor stacked body 400 is exposed to the plasma 123 before the resist mask is removed, and after that the resist mask is removed, whereby a particle such as an organic substance or a metal which adheres to the side surface of the semiconductor stacked body 400 is removed. After that, the semiconductor stacked body 400 is exposed to the plasma 124 generated in an atmosphere containing a rare gas. Thus, a portion of the semiconductor stacked body 400, which is not exposed to the plasma 123 for removing a particle such as an organic substance or a metal that exists before the resist mask is removed, can also be exposed to the plasma 124. Therefore, the first barrier region 127a can be formed on the side surface of the semiconductor stacked body 400 with high uniformity. Thus, the first barrier region 127a is formed on the side surface of the semiconductor stacked body 400, and the second barrier region 126b is formed on the top surface of the semiconductor stacked body 400.

In this manner, plasma treatment is performed in an oxidizing gas atmosphere or a nitriding gas atmosphere before the resist mask is removed, and then plasma treatment is performed in a rare gas atmosphere after the resist mask is removed, whereby an insulating region can be formed not only on the top surface of the impurity semiconductor layer but also on the side surface of the semiconductor stacked body, so that the on-state current of the transistor can be kept and the off-state current thereof can be reduced.

Figure 7B:
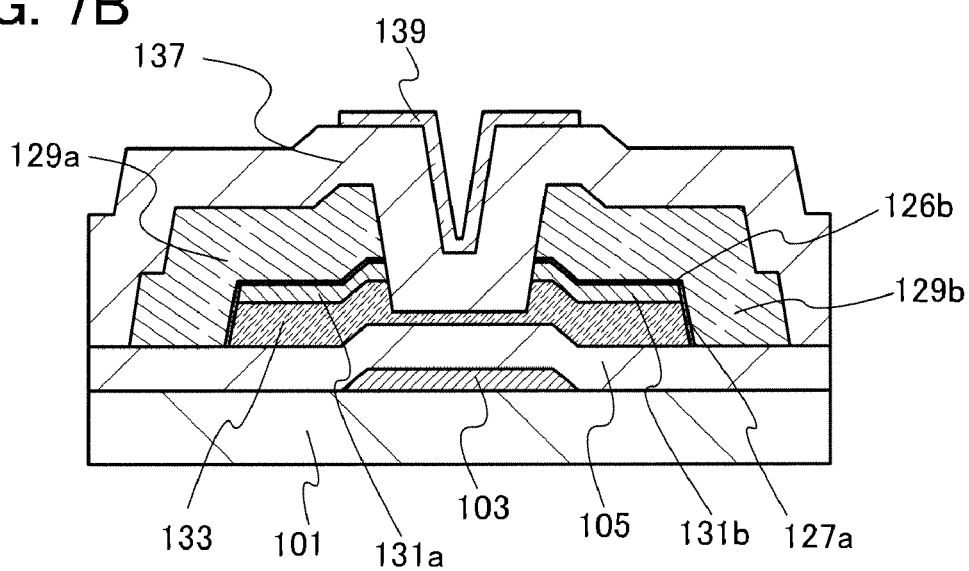

After that, through the steps similar to those of Embodiment 1, the transistor having little variation in characteristics, high on-state current, and high field-effect mobility, which is illustrated in FIG. 7B, can be manufactured.

Note that this embodiment can be applied to any of the other embodiments.

Embodiment 3

In this embodiment, a method for manufacturing a transistor having a structure different from the structures described in Embodiments 1 and 2 will be described with reference to FIGS. 8A and 8B.

In a manner similar to that of Embodiment 1, the first gate electrode 103, a second gate electrode 203, the gate insulating layer 105, the microcrystalline semiconductor layer 107, and the impurity semiconductor layer 113 are formed over the substrate 101 through the steps of FIGS. 1A and 1B. Then, the resist mask 115 is formed over the impurity semiconductor layer 113.

Figure 8A:
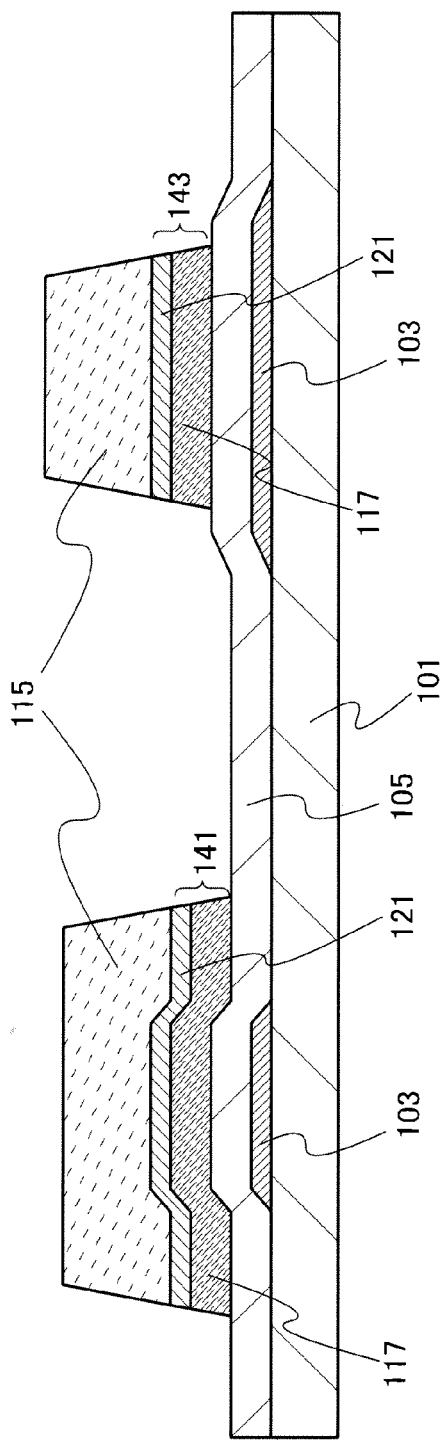
FIGS. 8A and 8B are cross-sectional views illustrating a method for manufacturing a transistor according to an embodiment of the present invention.

Next, the microcrystalline semiconductor layer 107 and the impurity semiconductor layer 113 are etched with use of the resist mask 115 to form a first semiconductor stacked body 141 whose end portion is located outside an end portion of the first gate electrode 103 and a second semiconductor stacked body 143 whose end portion is located inside an end portion of the second gate electrode 203 in a planar structure (see FIG. 8A).

Figure 8B:
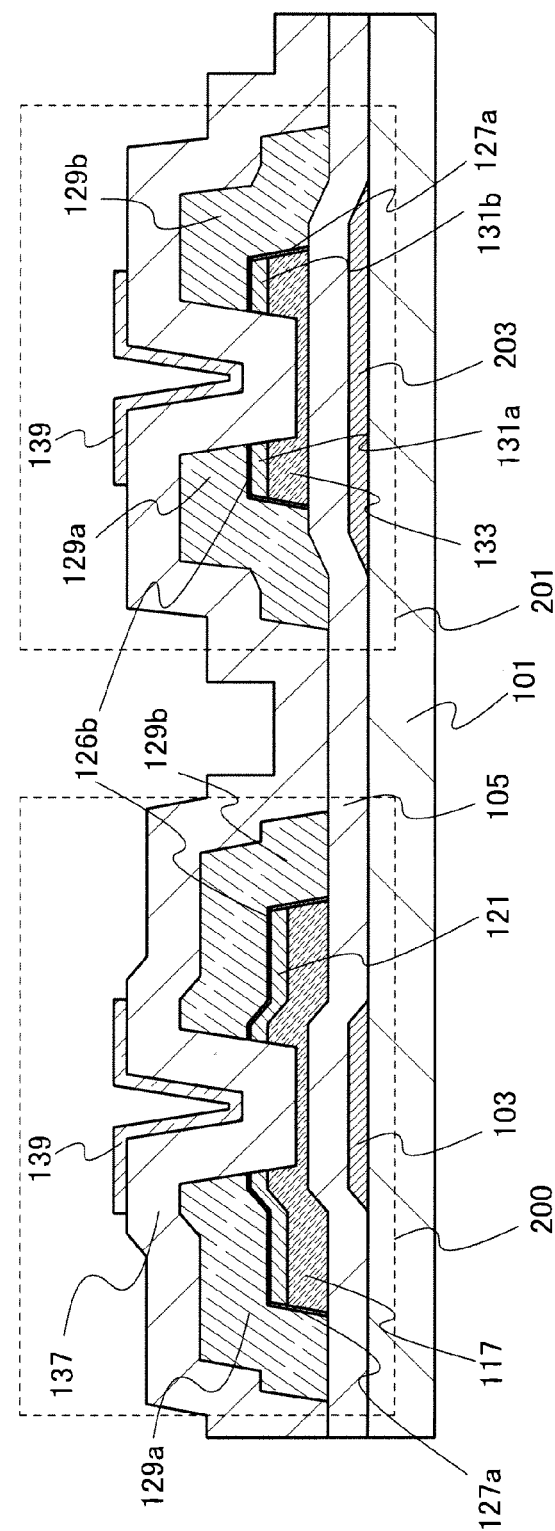

After that, through the steps similar to those of Embodiment 2, the first barrier region 127a is formed on each of side surfaces of the first semiconductor stacked body 141 and the second semiconductor stacked body 143, and the second barrier region 126b is formed on each of top surfaces of the first semiconductor stacked body 141 and the second semiconductor stacked body 143, whereby a transistor 200 and a transistor 201 which have low off-state current, high on-state current, and high field-effect mobility, which are illustrated in FIG. 8B, can be manufactured.

Note that this embodiment can be applied to any of the other embodiments.

Embodiment 4

In this embodiment, a method for manufacturing a transistor having a structure different from the structures described in Embodiments 1 to 3 will be described with reference to FIGS. 9A to 9C, and FIG. 10.

Figure 9A:
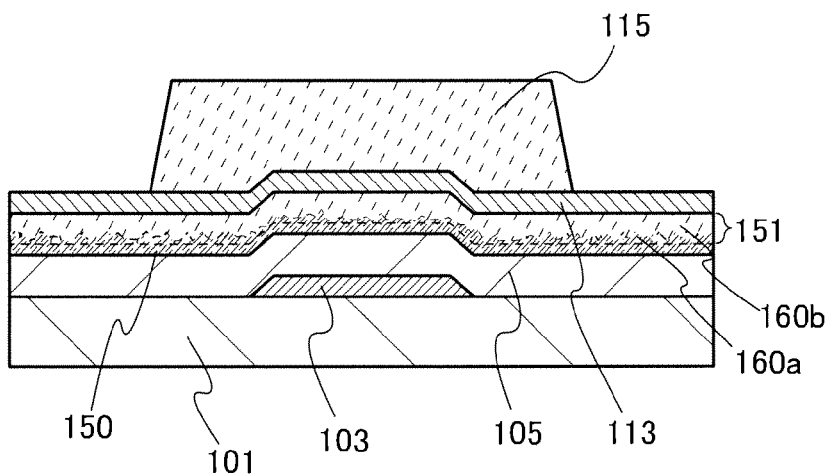
FIGS. 9A to 9C are cross-sectional views illustrating a method for manufacturing a transistor according to an embodiment of the present invention.

As illustrated in FIG. 9A, the gate electrode 103, the gate insulating layer 105, a microcrystalline semiconductor layer 150, a semiconductor layer 151, and the impurity semiconductor layer 113 are formed over the substrate 101. Then, the resist mask 115 is formed over the impurity semiconductor layer 113.

The semiconductor layer 151 which includes a microcrystalline semiconductor region 160a and an amorphous semiconductor region 160b can be formed under a condition that crystal growth is partly conducted (a condition that crystal growth is suppressed) with use of the microcrystalline semiconductor layer 150 as a seed crystal.

The microcrystalline semiconductor layer 150 can be formed in a manner similar to that of the microcrystalline semiconductor layer 107. The semiconductor layer 151 is formed in a treatment chamber of a plasma CVD apparatus, using plasma generated by glow discharge with the use of a mixture of a deposition gas containing silicon, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the microcrystalline semiconductor layer 107.

In this case, a flow ratio of the deposition gas containing silicon to hydrogen is the same as that for forming the microcrystalline semiconductor layer 107, and a gas containing nitrogen is used for the source gas, whereby crystal growth can be reduced as compared to the deposition condition of the microcrystalline semiconductor layer 107. Specifically, since the gas containing nitrogen is included in the source gas, the crystal growth is partly reduced at an early stage of deposition of the semiconductor layer 151; therefore, a conical or pyramidal microcrystalline semiconductor region grows, and an amorphous semiconductor region is formed. Further, at a middle stage and a later stage of the deposition, crystal growth in the conical or pyramidal microcrystalline semiconductor region stops and only the amorphous semiconductor region is formed. As a result, the microcrystalline semiconductor layer 150 and the semiconductor layer 151 which is formed using a well-ordered semiconductor layer having fewer defects and a steep tail of a level at a band edge in the valence band, can be formed.

In addition to the deposition gas containing silicon, a rare gas such as helium, neon, argon, krypton, or xenon is introduced into the source gas of the microcrystalline semiconductor layer 150 and the semiconductor layer 151, whereby the deposition rate can be increased.

As another method for forming the semiconductor layer, the following method can be employed: a surface of the microcrystalline semiconductor layer 150 is exposed to a gas containing nitrogen so that nitrogen is adsorbed onto the surface of the microcrystalline semiconductor layer 150, and then, the semiconductor layer 151 is formed using a deposition gas containing silicon and using hydrogen as a source gas, whereby a semiconductor layer including the microcrystalline semiconductor layer 150 and the semiconductor layer 151 can be formed.

Next, the microcrystalline semiconductor layer 150, the semiconductor layer 151, and the impurity semiconductor layer 113 are etched with use of the resist mask 115 to form a semiconductor stacked body 155. Note that the semiconductor stacked body 155 includes a stacked layer of a microcrystalline semiconductor layer 152, a microcrystalline semiconductor region 153a, an amorphous semiconductor region 153b, and the impurity semiconductor layer 121.

Figure 9B:
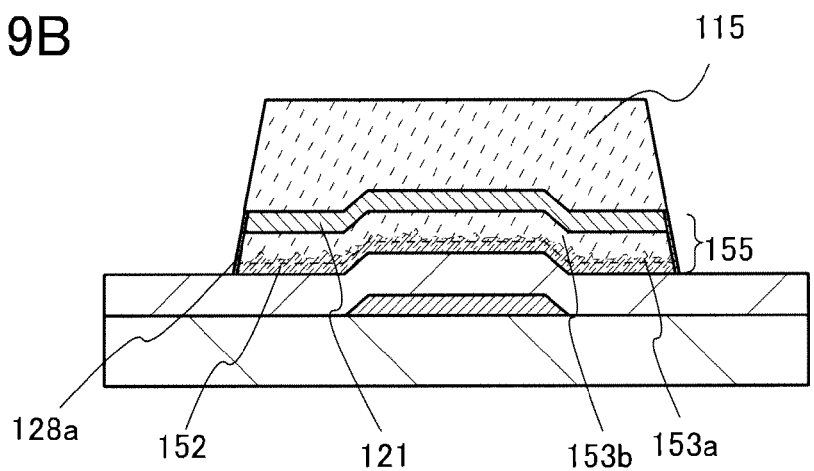
Figure 9C:
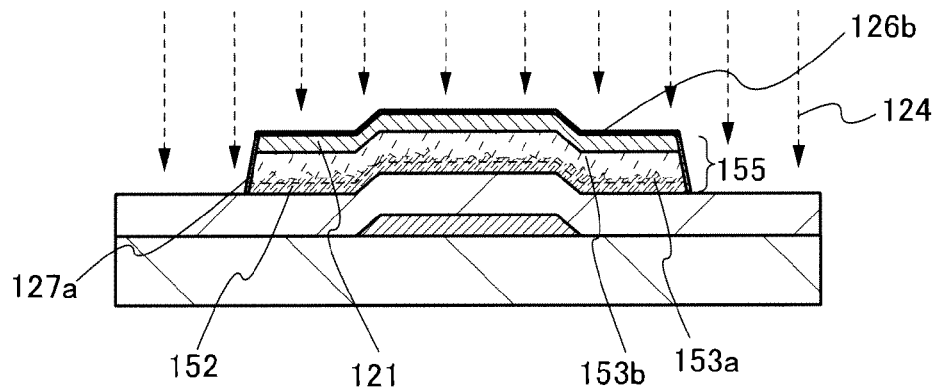

Next, through the steps similar to those of Embodiment 2, plasma treatment in which a side surface of the semiconductor stacked body 155 is exposed to the plasma 123 is performed with the resist mask 115 left, whereby the barrier region 128a is formed on a side surface of the semiconductor stacked body 155 (see FIG. 9B).

Next, after the resist mask 115 is removed, plasma treatment in which a surface of the semiconductor stacked body 155 is exposed to the plasma 124 is performed. Here, plasma is generated in an atmosphere of a rare gas such as helium, neon, argon, krypton, or xenon, and the semiconductor stacked body 155 is exposed to the plasma 124. Generation of plasma in a rare gas atmosphere causes a rare-gas radical to be generated. The radical has low reactivity though it has energy; this radical breaks the bonds between atoms in the semiconductor stacked body 155, which reduces density of the semiconductor layer. In particular, in the microcrystalline semiconductor layer 152, defects are caused by reduction in density, and the microcrystalline semiconductor layer 152 is made amorphous (see FIG. 9C).

In this manner, the semiconductor stacked body 155 is formed with use of the resist mask 115, the semiconductor stacked body 155 is exposed to the plasma 123 before the resist mask is removed, and after that the resist mask is removed, whereby a particle such as an organic substance or a metal which adheres to the side surface of the semiconductor stacked body 155 is removed. After that, the semiconductor stacked body 155 is exposed to the plasma 124 generated in an atmosphere containing a rare gas. Thus, a portion of the semiconductor stacked body 155, which is not exposed to the plasma 123 for removing a particle such as an organic substance or a metal that exists before the resist mask is removed, can also be exposed to the plasma 124. Therefore, the first barrier region 127a can be formed on the side surface of the semiconductor stacked body 155 with high uniformity. Thus, the first barrier region 127a is formed on the side surface of the semiconductor stacked body 155, and the second barrier region 126b is formed on a top surface of the semiconductor stacked body 155.

Figure 10:
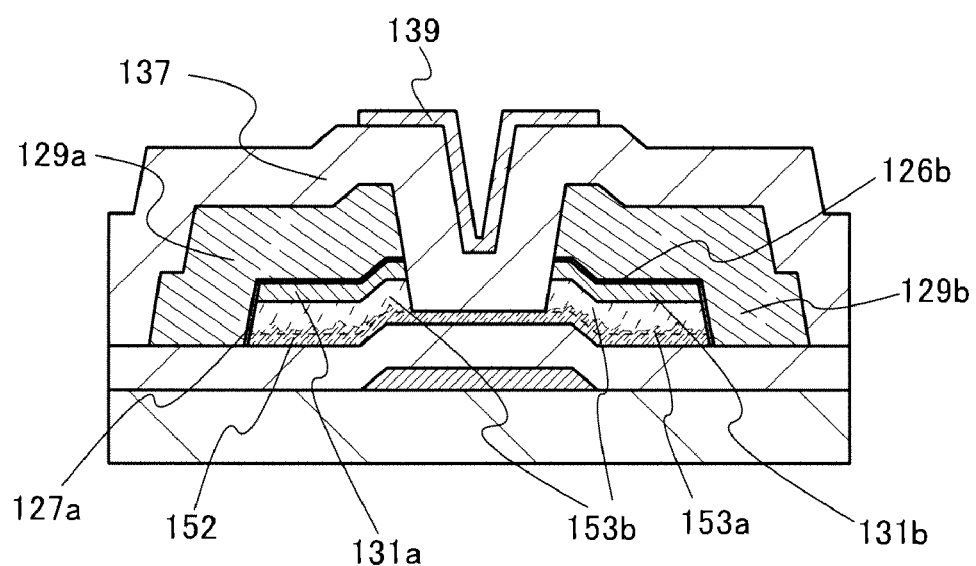
FIG. 10 is a cross-sectional view illustrating a method for manufacturing a transistor according to an embodiment of the present invention.

After that, through the steps similar to those of Embodiment 2, a transistor having high on-state current, high field-effect mobility, and low off-state current, which is illustrated in FIG. 10, can be manufactured.

Note that this embodiment can be applied to any of the other embodiments.

Embodiment 5

A transistor is manufactured, and a semiconductor device having a display function (also referred to as a display device) can be manufactured using the transistor in a pixel portion and further in a driver circuit. Further, part or whole of a driver circuit using the transistor can be formed over the same substrate as a pixel portion, whereby a system-on-panel can be obtained.

In the second transistor 201 including the second gate electrode 203, which is described in Embodiment 3 and illustrated in FIG. 8B, the microcrystalline semiconductor layer 133 is in contact with the wirings 129a and 129b in the vicinity of the gate insulating layer 105 which overlaps with the second gate electrode 203, and a Schottky junction is formed in the contact region. Therefore, holes are injected from the contact region to the microcrystalline semiconductor layer 133, which results in generation of off-state current. Thus, in the transistor of this embodiment, holes injected from the wirings 129a and 129b to the microcrystalline semiconductor layer 133 can be reduced by providing the first barrier region 127a that is an insulating region between the microcrystalline semiconductor layer 133 and the wirings 129a and 129b; accordingly, the off-state current of the transistor can be reduced. The transistor described in this embodiment has a structure in which the area of the microcrystalline semiconductor layer 133 is smaller than that of the gate electrode 203 and the whole microcrystalline semiconductor layer 133 overlaps with the gate electrode 203; accordingly, the gate electrode 203 serves as a light-blocking member with respect to light delivered to the microcrystalline semiconductor layer 133; thus, the microcrystalline semiconductor layer 133 can be prevented from being irradiated with light from the substrate 101 side, such as external light. Thus, in the second transistor 201, leakage current due to light can be reduced. The second transistor 201 is suitable for a pixel switching element in a display device, for example.

Further, in the first transistor 200 including the first gate electrode 103 described in Embodiment 3, the area of the microcrystalline semiconductor layer 133 is larger than that of the gate electrode 103, and the microcrystalline semiconductor layer 133 is irradiated with light from the substrate side, such as external light, which causes an increase in light leakage current of the transistor. However, unlike the second transistor 201 including the second gate electrode 203, the first transistor 200 including the first gate electrode 103 has a feature that a region where the microcrystalline semiconductor layer and the wiring are adjacent to each other with the first barrier region 127*a* interposed therebetween does not overlap with the gate electrode 103, and the off-state current due to holes injected from the contact region to the microcrystalline semiconductor layer is low. Therefore, the first transistor 200 is preferably used for a driver circuit of a display device, for example.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is provided, a state after a conductive film to be a pixel electrode is formed and before the pixel electrode is formed by etching the conductive film, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Embodiment 6

A semiconductor device disclosed in this specification can be applied to electronic paper. Electronic paper can be used for electronic appliances of a variety of fields as long as they can display data. For example, electronic paper can be applied to an electronic book (e-book) reader, a poster, an advertisement in a vehicle such as a train, a digital signage, a public information display (PID), displays of various cards such as a credit card, and the like. An example of the electronic device is illustrated in FIG. 11.

Figure 11:
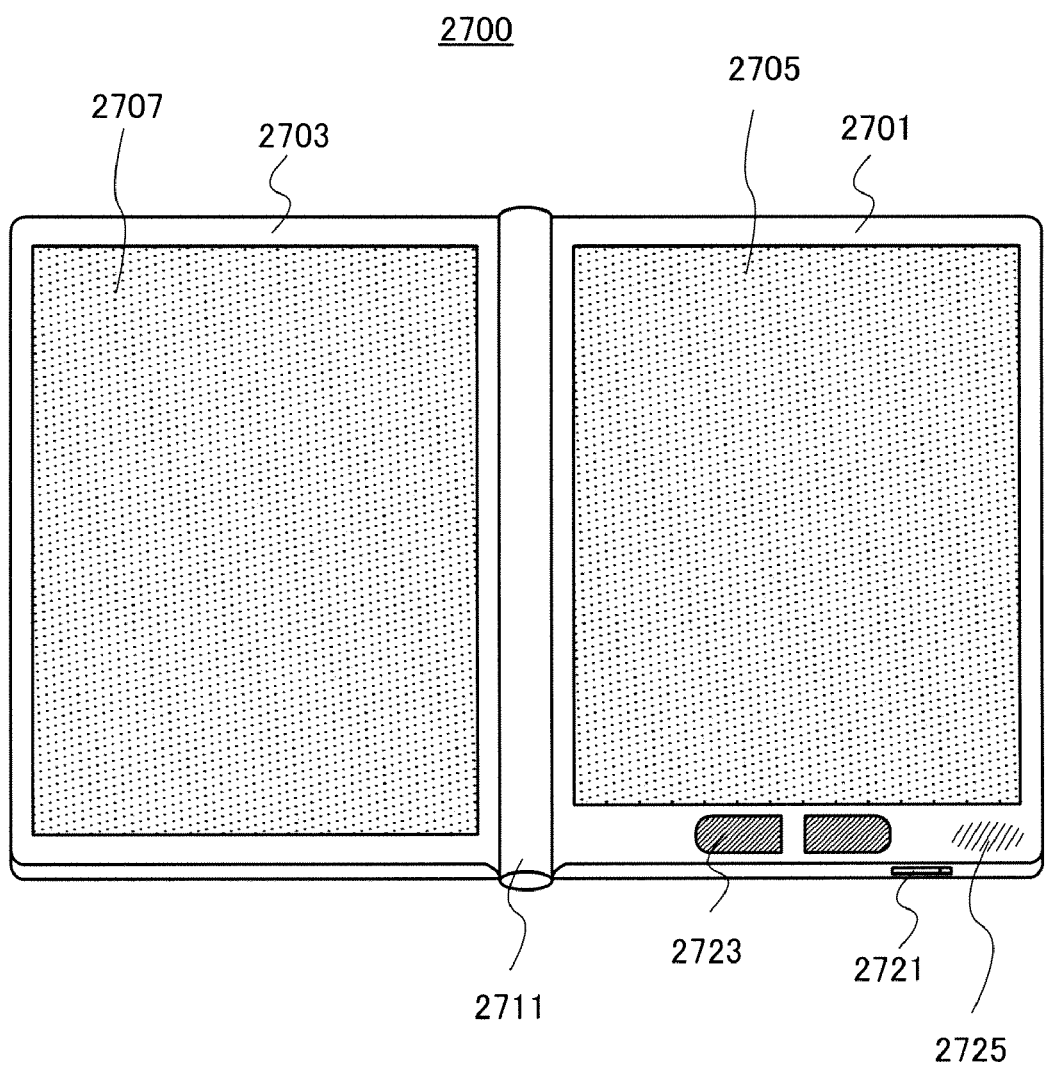
FIG. 11 is an external view illustrating an example of an electronic book reader.

FIG. 11 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 11) and graphics can be displayed on a display portion on the left side (the display portion 2707 in FIG. 11).

FIG. 11 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to an AC adapter, or various cables such as a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Embodiment 7

A semiconductor device disclosed in this specification can be applied to a variety of electronic appliances (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 12A:
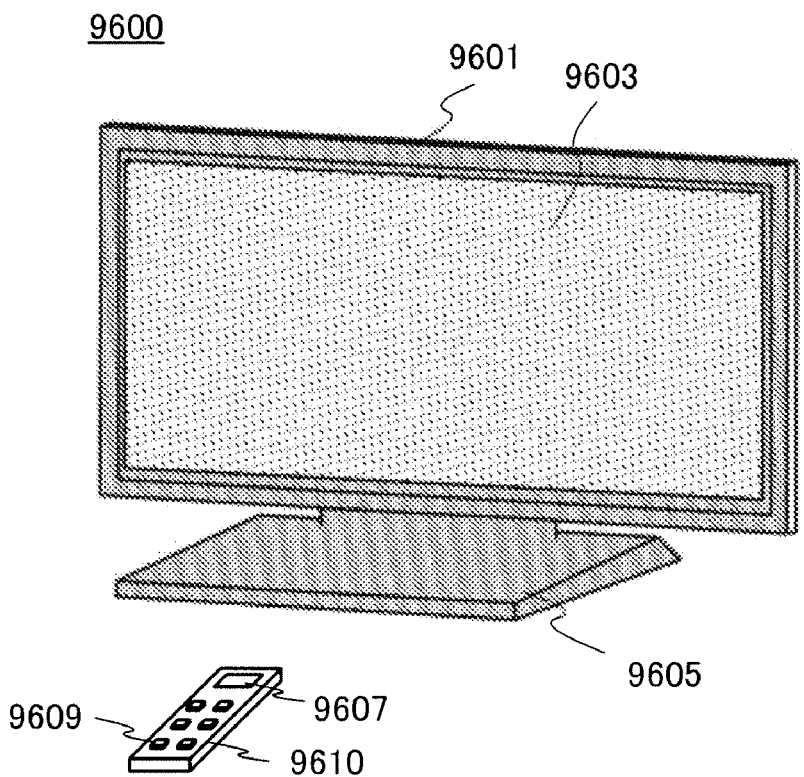
FIGS. 12A and 12B are external views respectively illustrating examples of a television set and a digital photo frame.

FIG. 12A illustrates an example of a television set. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 12B:
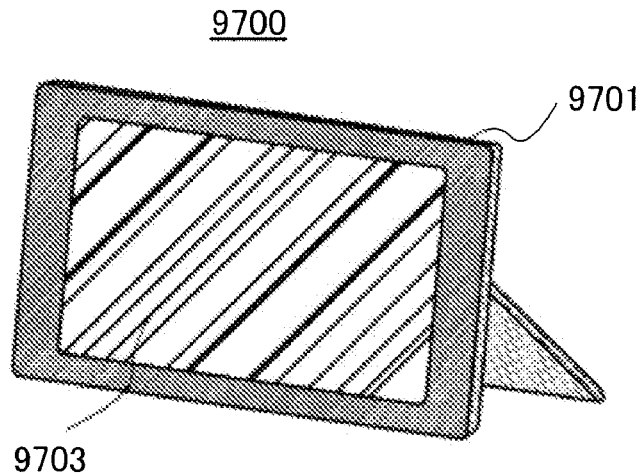

FIG. 12B illustrates an example of the digital photo frame. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 13:
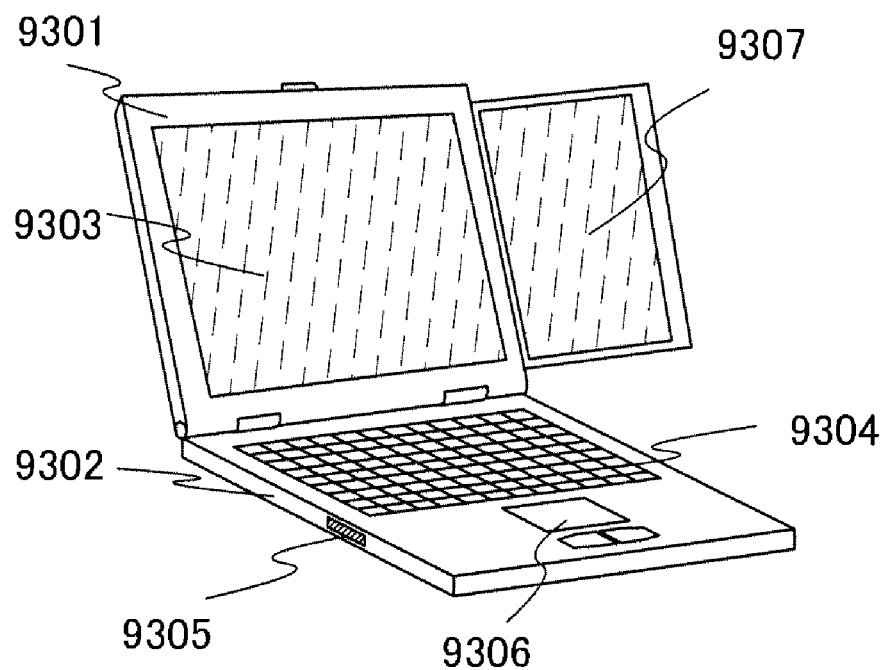
FIG. 13 is a perspective view illustrating an example of a portable computer.

FIG. 13 is a perspective view illustrating an example of a laptop computer.

In the laptop computer of FIG. 13, a top housing 9301 having a display portion 9303 and a bottom housing 9302 having a keyboard 9304 can overlap with each other by closing a hinge unit which connects the top housing 9301 and the bottom housing 9302. The laptop computer of FIG. 13 is convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the laptop computer illustrated in FIG. 13 can be provided with a receiver and the like to receive TV broadcasting to display images on the display portion. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying television broadcast is performed. Therefore, power can be consumed to the minimum, which is useful for the laptop computer whose battery capacity is limited.

EXAMPLE 1

In this example, variation in electric characteristics of the transistor in Embodiment 4 will be described.

A manufacturing process of the transistor of this example will be specifically described with reference to FIGS. 14A to 14C, FIGS. 15A to 15C, and FIG. 16.

An insulating layer 302 was formed over a substrate 301, and a gate electrode 303 was formed over the insulating layer 302.

Here, a glass substrate (EAGLE XG manufactured by Corning Incorporated) was used as the substrate 301.

A titanium layer having a thickness of 50 nm was formed over the insulating layer 302 by sputtering a titanium target with use of argon ions at a flow rate of 20 sccm. Then, an aluminum layer having a thickness of 100 nm was formed thereover by sputtering an aluminum target with use of argon ions at a flow rate of 50 sccm. Then, a titanium layer having a thickness of 50 nm was formed thereover by sputtering a titanium target with use of argon ions at a flow rate of 20 sccm. Next, after the titanium layer was coated with a resist, light exposure was performed with use of a first photomask. After that, development was performed, so that a resist mask was formed.

Next, etching was performed with use of the resist mask, so that the gate electrode 303 was formed. In this example, an inductively coupled plasma (ICP) apparatus was used. First etching was performed in conditions in which the ICP power was 600 W, the bias power was 250 W, the pressure was 1.2 Pa, and as for the etching gases, the flow rate of boron chloride was 60 sccm and the flow rate of chlorine was 20 sccm. After that, second etching was performed in conditions in which the ICP power was 500 W, the bias power was 50 W, the pressure was 2.0 Pa, and as for the etching gas, the flow rate of carbon fluoride was 80 sccm.

After that, the resist mask was removed.

Next, a gate insulating layer 304 and a microcrystalline semiconductor layer 305 were formed over the gate electrode 303 and the insulating layer 302.

Next, a semiconductor layer 310 including a microcrystalline semiconductor region 306a and an amorphous semiconductor region 306b was formed over the microcrystalline semiconductor layer 305 under a condition that crystal growth is partly conducted (a condition that crystal growth is suppressed) with use of the microcrystalline semiconductor layer 305 as a seed crystal. Then, an impurity semiconductor layer 307 was formed over the semiconductor layer 310.

Here, as the gate insulating layer 304, a silicon nitride oxide layer having a thickness of 300 nm was formed, and surface modification was performed by plasma treatment.

The silicon nitride oxide layer was formed by a plasma CVD method in which plasma discharge was performed under the following condition: silane, ammonia, dinitrogen monoxide, hydrogen, and nitrogen were introduced as source gases at flow rates of 15 sccm, 500 sccm, 100 sccm, 200 sccm, and 180 sccm, respectively; the pressure of the treatment chamber was 100 Pa; the substrate temperature was 280° C.; the RF power source frequency was 13.56 MHz; and the power of the RF power source was 200 W.

Plasma treatment was performed by a plasma CVD method in which plasma discharge was performed under the following condition: dinitrogen monoxide was introduced at a flow rate of 400 sccm; the pressure of the treatment chamber was 60 Pa; the substrate temperature was 280° C.; an RF power source frequency was 13.56 MHz; and the power of the RF power source was 300 W.

Next, after the substrate was taken out from the treatment chamber, the inside of the treatment chamber was cleaned, and an amorphous silicon layer was deposited as a protective layer in the treatment chamber. Then, the substrate was transferred into the treatment chamber, and the microcrystalline semiconductor layer 305 having a thickness of 70 nm was formed.

The microcrystalline semiconductor layer 305 was formed by a plasma CVD method in which plasma discharge was performed under the following condition: silane, hydrogen, and argon were introduced as source gases at flow rates of 2.5 sccm, 750 sccm, and 750 sccm, respectively; the pressure of the treatment chamber was 1237 Pa; the substrate temperature was 280° C.; an RF power source frequency was 13.56 MHz; and the power of the RF power source was 120 W.

The semiconductor layer 310 was formed by a plasma CVD method in which plasma discharge was performed under the following condition: silane, 1000 ppm ammonia (diluted with hydrogen), hydrogen, and argon were introduced as source gases at flow rates of 25 sccm, 100 sccm, 650 sccm, and 750 sccm, respectively; the pressure of the treatment chamber was 1237 Pa; the substrate temperature was 280° C.; an RF power source frequency was 13.56 MHz; and the power of the RF power source was 150 W.

As the impurity semiconductor layer 307, an amorphous silicon layer to which phosphorus was added was formed to have a thickness of 50 nm. The amorphous silicon layer to which phosphorus was added was formed by a plasma CVD method in which plasma discharge was performed under the following condition: the temperature for film formation was 280° C.; silane, 0.5% phosphine (diluted with silane), and hydrogen were introduced as source gases at flow rates of 90 sccm, 10 sccm, and 100 sccm, respectively; the pressure was 60 Pa; the RF power source frequency was 13.56 MHz; and the power of the RF power source was 30 W.

Figure 14A:
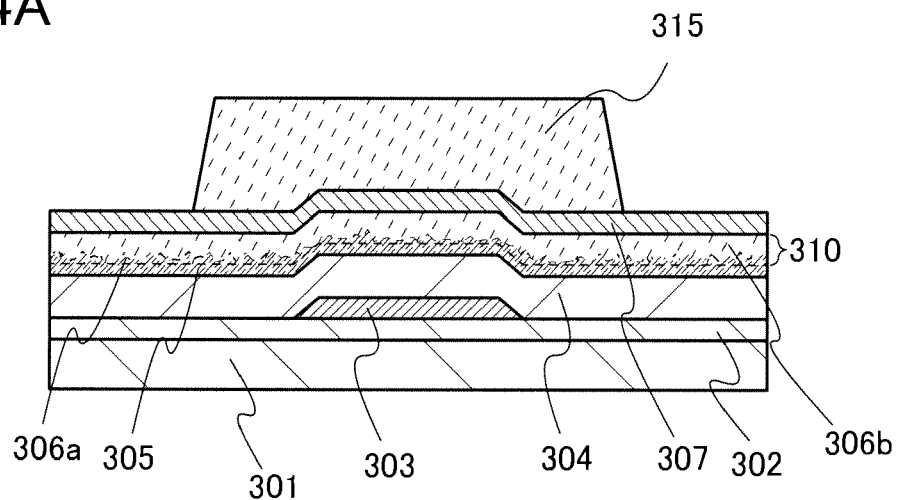
FIGS. 14A to 14C are cross-sectional views illustrating a method for manufacturing a transistor according to an example of the present invention.

Next, the impurity semiconductor layer 307 was coated with a resist, and light exposure was performed with use of a second photomask. After that, development was performed, so that a resist mask 315 was formed. The steps up to here are illustrated in FIG. 14A.

Figure 14B:
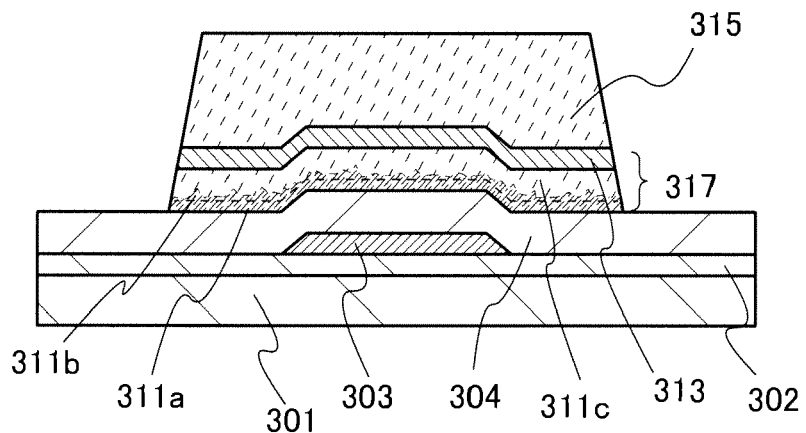

The microcrystalline semiconductor layer 305, the semiconductor layer 310, and the impurity semiconductor layer 307 were etched with use of the resist mask to form a semiconductor stacked body 317. The semiconductor stacked body 317 includes a stacked layer of a microcrystalline semiconductor layer 311a, a microcrystalline semiconductor region 311b, an amorphous semiconductor region 311c, and an impurity semiconductor layer 313. Here, Sample 1, Sample 2, and Sample 4 were each formed so that an end portion of the semiconductor stacked body 317 was located outside an end portion of the gate electrode in a planar structure. Sample 3 was formed so that the end portion of the semiconductor stacked body 317 was located inside the end portion of the gate electrode in a planar structure. The steps up to here are illustrated in FIG. 14B.

Here, etching was performed with use of an ICP apparatus under the following condition: the ICP power was 450 W; the bias power was 100 W; the pressure was 2.0 Pa; and boron chloride, carbon fluoride, and oxygen were used as etching gases at flow rates of 36 sccm, 36 sccm, and 8 sccm, respectively.

Next, each of Sample 2, Sample 3, and Sample 4 was subjected to plasma treatment in which a side surface of the semiconductor stacked body 317 was exposed to plasma 323 was performed with the resist mask 315 left.

Figure 14C:
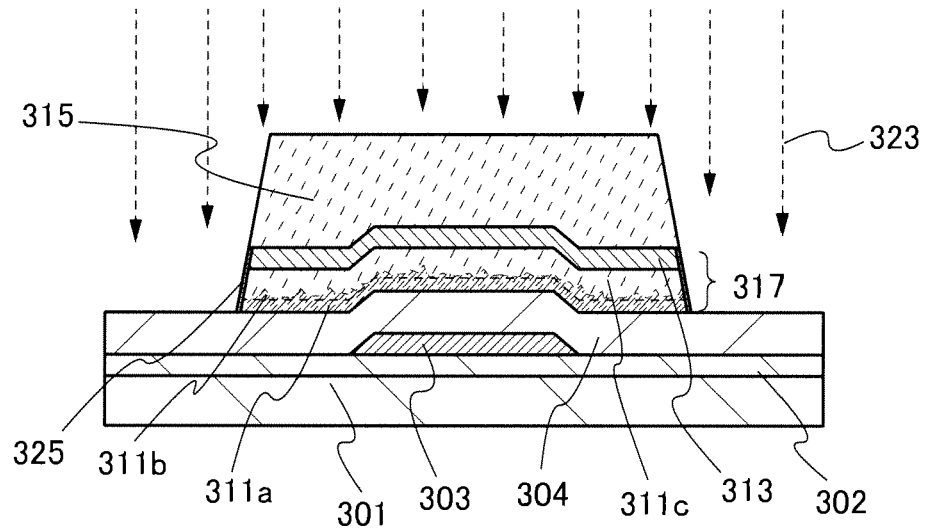

With use of the ICP apparatus, each of Sample 2, Sample 3, and Sample 4 was subjected to plasma treatment under the following condition: the ICP power was 2000 W; the bias power was 350 W; the pressure was 0.67 Pa; and the atmosphere was an oxygen atmosphere at a flow rate of 100 sccm, so that a barrier region 325 was formed (see FIG. 14C).

After that, the resist mask was removed.

Figure 15A:
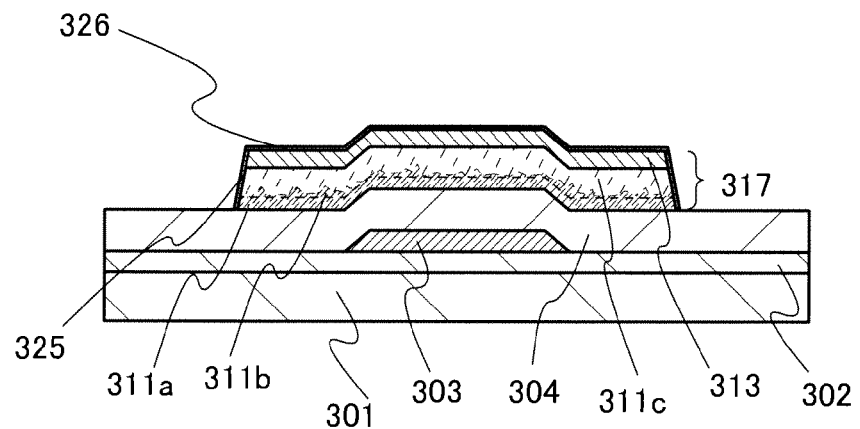
FIGS. 15A to 15C are cross-sectional views illustrating a method for manufacturing a transistor according to an example of the present invention.

With use of a plasma CVD apparatus, each of Sample 1, Sample 2, and Sample 3 was subjected to plasma treatment under a condition that the RF power source frequency was 13.56 MHz; the power of the RF power source was 150 W; the pressure was 4000 Pa; and the atmosphere was an argon atmosphere at a flow rate of 1650 sccm, so that a barrier region 326 was formed (see FIG. 15A).

Figure 15B:
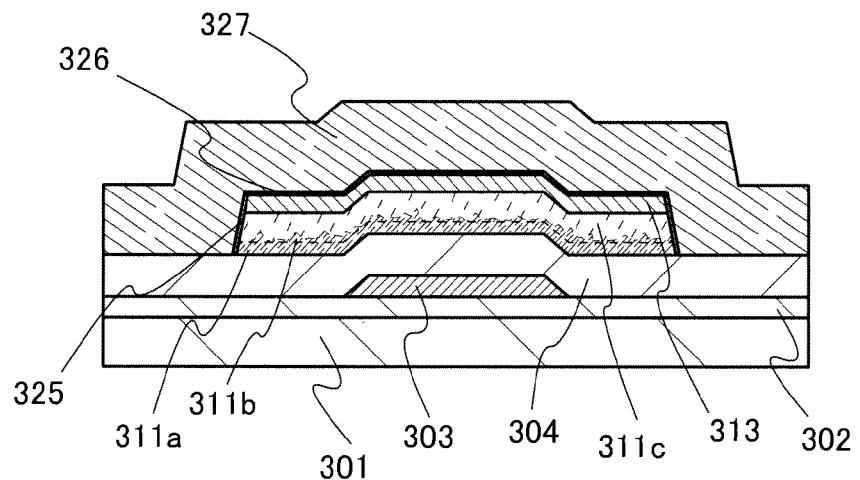

Next, as illustrated in FIG. 15B, a conductive layer 327 was formed to cover the gate insulating layer 304, and the semiconductor stacked body 317. Here, after a titanium layer having a thickness of 50 nm was formed by a sputtering of a titanium target with use of argon ions with a flow rate of 20 sccm, an aluminum layer having a thickness of 200 nm was formed over the titanium layer by a sputtering of an aluminum target with use of argon ions with a flow rate of 50 sccm. Then, a titanium layer having a thickness of 50 nm was formed over the aluminum layer by a sputtering of a titanium target with use of argon ions with a flow rate of 20 sccm.

Next, after the conductive layer 327 was coated with a resist, light exposure was performed with use of a third photomask. After that, development was performed, so that a resist mask was formed. With use of the resist mask, dry etching was performed on the conductive layer 327 to form a wiring 329. Dry etching was performed on the impurity semiconductor layer 313 to form a source and drain regions 330. Further, part of the amorphous semiconductor region 311c, the microcrystalline semiconductor region 311b, and the microcrystalline semiconductor layer 311a was etched.

Here, the etching conditions were as follows: the ICP power was 450 W, the bias power was 100 W, the pressure was 1.9 Pa, and the etching gas included boron chloride with a flow rate of 60 sccm and chlorine with a flow rate of 20 sccm. The semiconductor stacked body 317 was etched so that the depth of the recessed portion of the semiconductor stacked body 317 was greater than or equal to 20 nm and less than or equal to 40 nm, and the thickness of a region of the semiconductor stacked body 317 that was not covered with the wiring 329 was greater than or equal to 165 nm and less than or equal to 185 nm. Note that in this example, the wirings 329 serving as a source electrode and a drain electrode had a straight line shape in a planar structure.

Figure 15C:
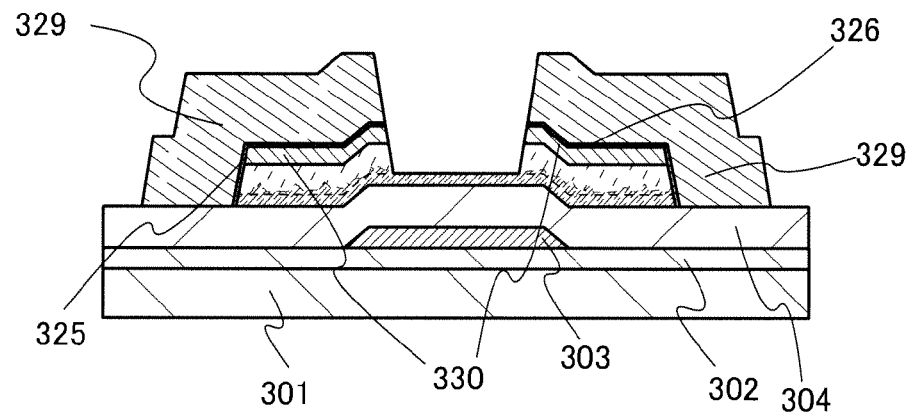

After that, the resist mask was removed. The steps up to here are illustrated in FIG. 15C.

Next, the surface of the semiconductor stacked body 317 was irradiated with carbon fluoride plasma, so that an impurity remaining on the surface of the semiconductor stacked body 317 was removed. Here, the etching conditions were as follows: the source power was 1000 W, the bias power was 0 W, the pressure was 0.67 Pa, and the etching gas was carbon fluoride with a flow rate of 100 sccm.

Next, a silicon nitride layer was formed as an insulating layer 337. As the deposition conditions at this time, silane, $NH_3$, nitrogen, and hydrogen were introduced as source gases at flow rates of 20 sccm, 220 sccm, 450 sccm, and 450 sccm, respectively, the pressure in the treatment chamber was 160 Pa, the substrate temperature was 250° C., and plasma discharge was performed at an output of 200 W, whereby the silicon nitride layer having a thickness of 300 nm was formed.

Next, although not illustrated here, after the insulating layer 337 was coated with a resist, light exposure was performed with use of a fourth photomask. After that, development was performed, so that a resist mask was formed. With use of the resist mask, the insulating layer was partly etched with a dry etching method, so that the wiring 329 functioning as the source and drain electrodes was partly exposed. In addition, part of the insulating layer 337 and part of the gate insulating layer 304 were etched with a dry etching method, so that the gate electrode 303 was exposed. After that, the resist mask was removed.

Next, a conductive film was formed over the insulating layer 337. After that, a resist was applied over the conductive film and was irradiated with light with the use of a fifth photomask and developed to form a resist mask. For the single-gate transistor, part of the conductive film was subjected to wet etching with use of the resist mask, so that a conductive film connected to the wiring 329, and a conductive film connected to the gate electrode 303 were formed. For the dual-gate transistor, part of the conductive film was subjected to wet etching with use of the resist mask, so that a conductive film connected to the wiring 329, and the back gate electrode 339 connected to the gate electrode 303 were formed. Note that the conductive film functions as a pad used at the time of measuring electric characteristics of the transistor.

Here, as the conductive film, an indium tin oxide having a thickness of 50 nm was formed by a sputtering method, and was subjected to wet etching treatment to form the back gate electrode 339. Although not illustrated, the back gate electrode 339 was connected to the gate electrode 303. After that, the resist mask was removed.

Figure 16:
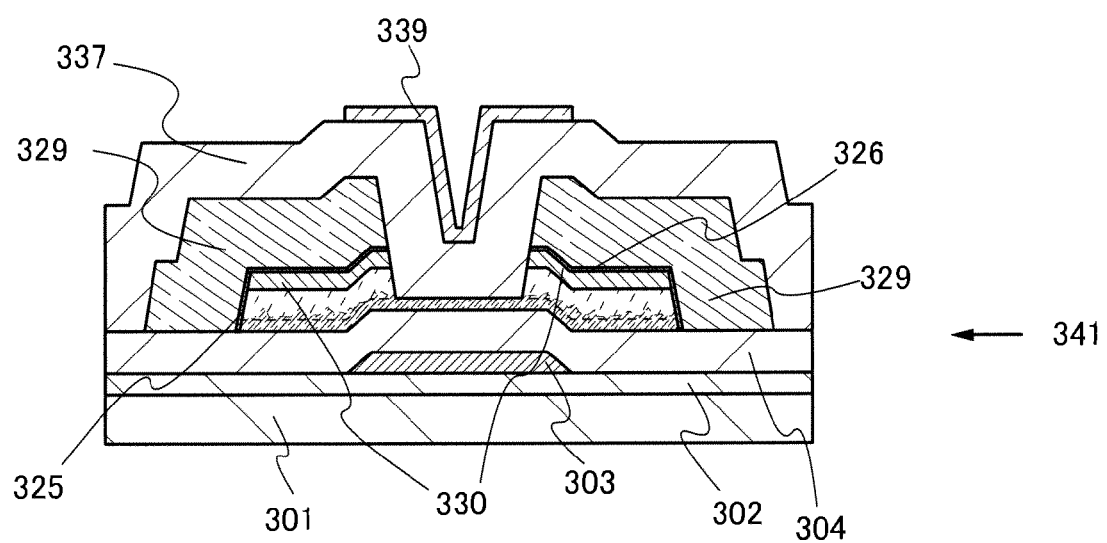
FIG. 16 is a cross-sectional view illustrating a method for manufacturing a transistor according to an example of the present invention.

Though the above steps, a transistor 341 was manufactured (see FIG. 16).

Next, FIGS. 17A and 17B and FIGS. 18A and 18B show measurement results of electric characteristics of the single-gate transistors. In each of FIGS. 17A and 17B and FIGS. 18A and 18B, the horizontal axis indicates the gate voltage Vg, the left vertical axis indicates the drain current Id, and the right vertical axis indicates the field-effect mobility μFE. The current-voltage characteristics at drain voltages of 1 V and 10 V are shown using solid lines and the field-effect mobility at a drain voltage of 10 V is shown using dashed lines. Note that the field-effect mobility of the transistor in this example was calculated under the following condition: the channel length was 3.4 μm; the channel width was 20.1 μm; the thickness of the gate insulating layer was 300 nm; and the average relative permittivity was 5.6.

Figure 17A:
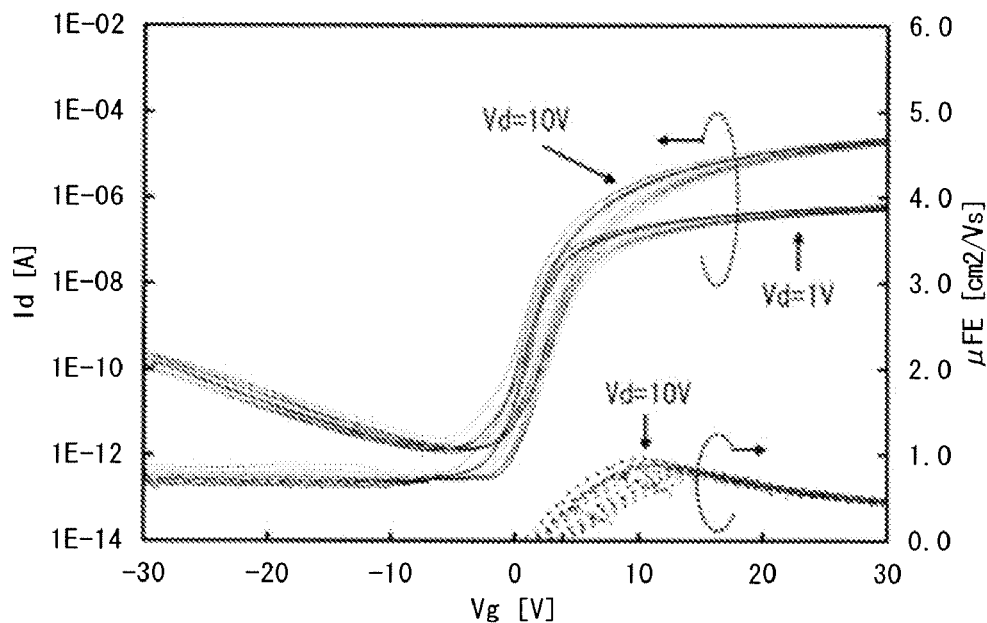
FIGS. 17A and 17B are graphs each showing electric characteristics of a transistor.
Figure 17B:
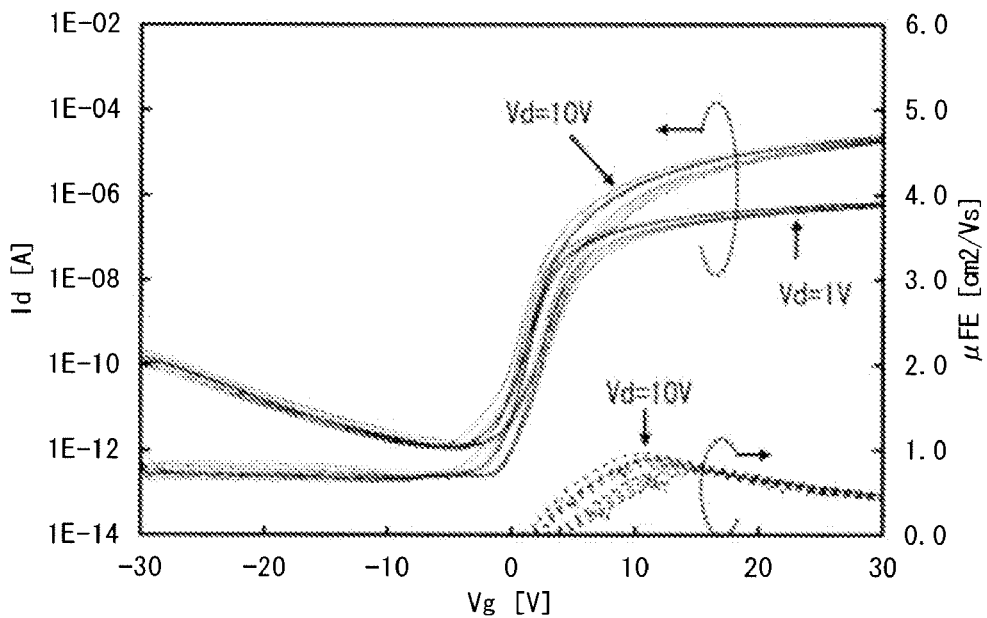
Figure 18A:
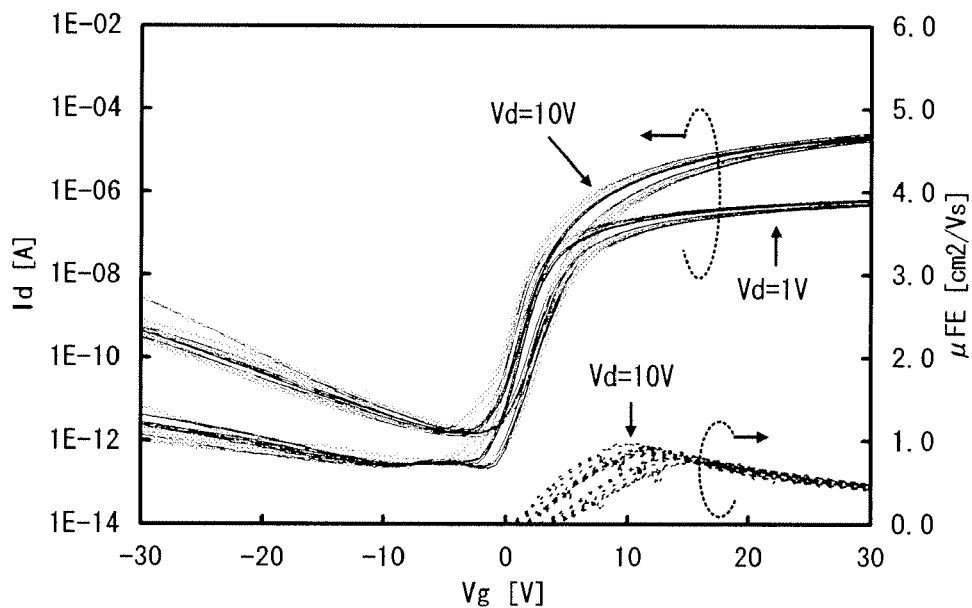
FIGS. 18A and 18B are graphs each showing electric characteristics of a transistor.
Figure 18B:
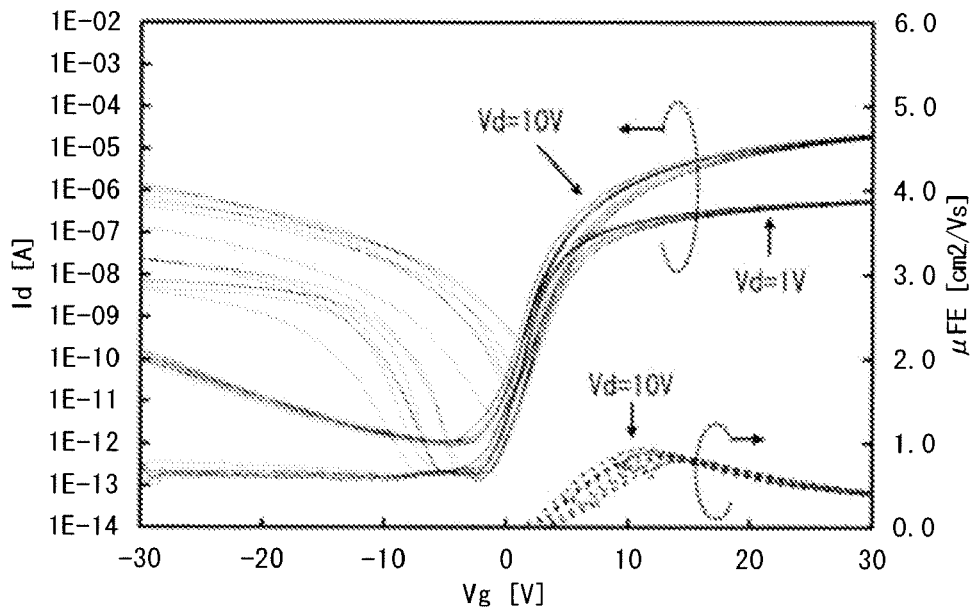

FIG. 17A shows electric characteristics of the transistor of Sample 1. FIG. 17B shows electric characteristics of the transistor of Sample 2, FIG. 18A shows electric characteristics of the transistor of Sample 3, and FIG. 18B shows electric characteristics of the transistor of Sample 4. Note that the measurement results of the electric characteristics shown in FIGS. 17A and 17B and FIGS. 18A and 18B were obtained by measurement at 16 points on the surface of the manufactured sample.

Further, Table 1 shows, in each of the transistors of Sample 1 to Sample 4, the on-state current at a drain voltage of 10 V and a gate voltage of 15 V (denoted by Ion (Vg=15 V)), the minimum off-state current (denoted by Ioff(min)), the off-state current at a gate voltage which is lower than the gate voltage at the minimum off-state current by 10 V (denoted by Ioff(min. −10 V)), the threshold voltage (denoted by Vth), the S value (denoted by S-value), and the field-effect mobility at a drain voltage of 10 V (μFE (Vd=10 V). Note that values in Table 1 were average values obtained by measurement at 16 points on the surface of the manufactured sample.

TABLE 1

|  |  | Sample 1 | Sample 2 | Sample 3 | Sample 4 |
|---|---|---|---|---|---|
| Ion(Vg = 15 V) | [μA] | 4.66 | 4.41 | 4.36 | 4.14 |
| Ioff(min.) | [pA] | 1.44 | 1.22 | 1.57 | 42.08 |

TABLE 1-continued

|  |  | Sample 1 | Sample 2 | Sample 3 | Sample 4 |
|---|---|---|---|---|---|
| Ioff(min.-10 V) | [pA] | 5.60 | 4.47 | 10.03 | 10393.54 |
| log(Ion(Vg = 15 V)/ Ioff(min.)) |  | 6.50 | 6.54 | 6.42 | 5.93 |
| Vth | [V] | 4.61 | 4.87 | 4.90 | 5.15 |
| S-value | [V/dec.] | 1.01 | 0.99 | 0.98 | 1.05 |
| μFE(Vd = 10 V) | [cm$^2$/Vs] | 0.87 | 0.86 | 0.86 | 0.87 |

The results of Table 1, FIGS. 17A and 17B, and FIGS. 18A and 18B show that Sample 4 which was not subjected to argon plasma treatment had large variation in the off-state current and had many defects on the surface. As compared to Sample 4, Sample 1 and Sample 2 had little variation in the off-state current. Further, as compared to Sample 1 which was subjected to only argon plasma treatment, Sample 2 which was subjected to oxygen plasma treatment and argon plasma treatment had a threshold voltage which was shifted positively and had very favorable electric characteristics.

Further, Sample 3, which had a structure different from the structures of Sample 1, Sample 2, and Sample 4 and which was subjected to oxygen plasma treatment and argon plasma treatment, had favorable electric characteristics as shown in FIG. 18A.

From the above, as in Sample 1, the semiconductor stacked body 317 is formed, the resist mask is removed, and then, the semiconductor stacked body is exposed to argon plasma, so that the barrier regions are formed on the top surface and the side surface of the semiconductor stacked body, whereby the off-state current of the transistor and variation in the off-state current can be reduced. Further, as in Sample 2 and Sample 3, the side surface of the semiconductor stacked body 317 is exposed to oxygen plasma and argon plasma, so that an insulating region and an amorphous region are formed on the side surface of the semiconductor stacked body, whereby the off-state current of the transistor and variation in the off-state current can be reduced. Accordingly, by use of the transistors of Samples 1 to 3 for display devices, a storage capacitor in a pixel can be small and the aperture ratio can be increased, so that higher image quality and high definition of display devices can be obtained.

This application is based on Japanese Patent Application Serial No. 2010-223447 filed with Japan Patent Office on Oct. 1, 2010, the entire contents of which are hereby incorporated by reference.

What is claimed is:

1. A method for manufacturing a transistor comprising the steps of:
   forming a gate electrode;
   forming a gate insulating layer over the gate electrode;
   forming a semiconductor layer over the gate insulating layer;
   forming an impurity semiconductor layer over the semiconductor layer;
   forming a mask over the impurity semiconductor layer, and then etching the semiconductor layer and the impurity semiconductor layer with use of the mask to form a semiconductor stacked body;
   removing the mask and then exposing the semiconductor stacked body to plasma generated in an atmosphere containing a rare gas;
   forming a conductive layer over the semiconductor stacked body after exposing the semiconductor stacked body to the plasma; and etching part of the conductive layer, the impurity semiconductor layer and the semiconductor layer in the semiconductor stacked body to form a first wiring layer, a second wiring layer, a source region, and a drain region.

2. The method for manufacturing a transistor according to claim 1, wherein the atmosphere containing the rare gas further comprises phosphorus or boron.

3. The method for manufacturing a transistor according to claim 1, wherein a back gate electrode is provided so as to overlap with a channel formation region of the semiconductor layer with an insulating layer interposed between.

4. The method for manufacturing a transistor according to claim 1, wherein the semiconductor layer includes a microcrystalline semiconductor layer and an amorphous semiconductor layer which is formed over the microcrystalline semiconductor layer.

5. The method for manufacturing a transistor according to claim 1, wherein the semiconductor layer and the impurity semiconductor layer are etched so that an end portion of the semiconductor stacked body is located outside an end portion of the gate electrode in a planar structure.

6. The method for manufacturing a transistor according to claim 1, wherein the semiconductor layer and the impurity semiconductor layer are etched so that an end portion of the semiconductor stacked body is located inside an end portion of the gate electrode in a planar structure.

7. A method for manufacturing a transistor comprising the steps of:
    forming a gate electrode;
    forming a gate insulating layer over the gate electrode;
    forming a semiconductor layer over the gate insulating layer;
    forming an impurity semiconductor layer over the semiconductor layer;
    forming a mask over the impurity semiconductor layer, and then etching the semiconductor layer and the impurity semiconductor layer with use of the mask to form a semiconductor stacked body;
    exposing the semiconductor stacked body to plasma generated in an oxygen gas atmosphere;
    removing the mask and then exposing the semiconductor stacked body to plasma generated in an atmosphere containing a rare gas;
    forming a conductive layer over the semiconductor stacked body after exposing the semiconductor stacked body to the plasma generated in an atmosphere containing the rare gas;
    etching part of the conductive layer, the impurity semiconductor layer and the semiconductor layer in the semiconductor stacked body to form a first wiring layer, a second wiring layer, a source region, and a drain region.

8. The method for manufacturing a transistor according to claim 7, wherein the atmosphere containing the rare gas further comprises phosphorus or boron.

9. The method for manufacturing a transistor according to claim 7, wherein a back gate electrode is provided so as to overlap with a channel formation region of the semiconductor layer with an insulating layer interposed between.

10. The method for manufacturing a transistor according to claim 7, wherein the semiconductor layer includes a microcrystalline semiconductor layer and an amorphous semiconductor layer which is formed over the microcrystalline semiconductor layer.

11. The method for manufacturing a transistor according to claim 7, wherein the semiconductor layer and the impurity semiconductor layer are etched so that an end portion of the semiconductor stacked body is located outside an end portion of the gate electrode in a planar structure.

12. The method for manufacturing a transistor according to claim 7, wherein the semiconductor layer and the impurity semiconductor layer are etched so that an end portion of the semiconductor stacked body is located inside an end portion of the gate electrode in a planar structure.

* * * * *